United States Patent
Jeong et al.

(10) Patent No.: US 10,381,581 B2
(45) Date of Patent: Aug. 13, 2019

(54) DISPLAY APPARATUS WITH FLEXIBLE SUBSTRATE

(71) Applicant: Samsung Display Co., Ltd., Yongin-si, Gyeonggi-do (KR)

(72) Inventors: Changyong Jeong, Yongin-si (KR); Soomin An, Yongin-si (KR); Beunghwa Jeong, Yongin-si (KR); Mugyeom Kim, Yongin-si (KR); Sunghoon Kim, Yongin-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 15/488,250

(22) Filed: Apr. 14, 2017

(65) Prior Publication Data

US 2018/0090698 A1    Mar. 29, 2018

(30) Foreign Application Priority Data

Sep. 27, 2016  (KR) ........................ 10-2016-0124241

(51) Int. Cl.
*H01L 51/00* (2006.01)
*H01L 27/32* (2006.01)
*H01L 51/52* (2006.01)

(52) U.S. Cl.
CPC ...... *H01L 51/0097* (2013.01); *H01L 27/3276* (2013.01); *H01L 51/003* (2013.01); *H01L 51/5253* (2013.01); *H01L 2227/326* (2013.01); *H01L 2251/5338* (2013.01)

(58) Field of Classification Search
CPC .............. H01L 51/0097; H01L 51/003; H01L 51/5253; H01L 27/3276; H01L 51/5287
See application file for complete search history.

(56) References Cited

U.S. PATENT DOCUMENTS

| | | | |
|---|---|---|---|
| 9,176,535 B2 * | 11/2015 | Bohn | .................... G06F 1/1641 |
| 2008/0018631 A1 * | 1/2008 | Hioki | ................ G02F 1/133305 |
| | | | 345/206 |
| 2008/0055831 A1 | 3/2008 | Satoh | |
| 2010/0238612 A1 * | 9/2010 | Hsiao | ................ G02F 1/133305 |
| | | | 361/679.01 |
| 2012/0081849 A1 | 4/2012 | Hsiao et al. | |
| 2013/0249740 A1 * | 9/2013 | Shedletsky | .............. H01Q 1/38 |
| | | | 343/700 MS |
| 2014/0240985 A1 | 8/2014 | Kim et al. | |
| 2015/0034932 A1 | 2/2015 | Choi | |
| 2015/0090960 A1 | 4/2015 | Ma et al. | |

(Continued)

FOREIGN PATENT DOCUMENTS

| KR | 10-2013-0015142 | 2/2013 |
|---|---|---|
| KR | 10-2014-0118222 | 10/2014 |

(Continued)

*Primary Examiner* — Cheung Lee
(74) *Attorney, Agent, or Firm* — Innovation Counsel LLP

(57) ABSTRACT

A display apparatus includes a support substrate, a flexible substrate, and a display unit. The flexible substrate overlaps the support substrate and includes a first portion, a second portion, and a flexible part between the first portion and the second portion. The flexible part includes an uneven surface. The uneven surface includes protrusions, recesses, and/or openings of through holes. The display unit overlaps the first portion.

12 Claims, 23 Drawing Sheets

(56) References Cited

U.S. PATENT DOCUMENTS

| | | | |
|---|---|---|---|
| 2015/0102298 A1* | 4/2015 | Namkung | H01L 51/0097 |
| | | | 257/40 |
| 2015/0188084 A1* | 7/2015 | Kang | H01L 51/5259 |
| | | | 257/40 |
| 2016/0014919 A1* | 1/2016 | Huitema | G06F 1/1652 |
| | | | 313/511 |
| 2016/0079336 A1 | 3/2016 | Youn et al. | |
| 2016/0085352 A1 | 3/2016 | Kang | |
| 2016/0093644 A1* | 3/2016 | Ki | H01L 29/78672 |
| | | | 257/40 |
| 2016/0093683 A1 | 3/2016 | Lee et al. | |
| 2016/0141551 A1* | 5/2016 | Seo | H01L 51/5253 |
| | | | 257/40 |
| 2017/0223821 A1* | 8/2017 | Wang | H05K 1/0206 |
| 2017/0263881 A1* | 9/2017 | Choi | H01L 51/524 |

FOREIGN PATENT DOCUMENTS

| | | |
|---|---|---|
| KR | 10-2015-0027956 | 3/2015 |
| KR | 10-2015-0037613 | 4/2015 |

\* cited by examiner

DISPLAY APPARATUS WITH FLEXIBLE SUBSTRATE

CROSS-REFERENCE TO RELATED APPLICATION

This application claims the benefit of Korean Patent Application No. 10-2016-0124241, filed on Sep. 27, 2016, in the Korean Intellectual Property Office; the disclosure of the Korean Patent Application is incorporated herein in its entirety by reference.

BACKGROUND

1. Field

The technical field is related to display apparatuses and methods of manufacturing display apparatuses.

2. Description of the Related Art

In general, a display apparatus has a display unit located on a substrate. A portion of the display apparatus may be bent to facilitate visibility at various angles or to reduce a footprint of the display apparatus.

SUMMARY

One or more embodiments may be related to display apparatuses with satisfactory flexibility and/or may be related to methods of manufacturing display apparatuses.

According to one or more embodiments, a display apparatus may include the following elements: a support substrate; a flexible substrate on/over the support substrate, the flexible substrate including a first flexible part located between a first portion and a second portion to be bent around a first bending axis in the first flexible part and a plurality of through holes or a plurality of first uneven portions located at an inside surface of the first flexible part; and a display unit on/over at least the first portion of the flexible substrate.

A rear surface of the first portion and a rear surface of the second portion may face each other, and the inside surface of the first flexible part may be between the rear surface of the first portion and the rear surface of the second portion and connect the rear surface of the first portion to the rear surface of the second portion.

The display apparatus may further include: a pad in the second portion; and a plurality of conductive layers electrically connected to the pad and extending to the first portion or the first flexible part.

The plurality of through holes in the flexible substrate may be located in a region between the conductive layers.

The flexible substrate may further include: a second flexible part included in the first portion to be bent around a second bending axis in the second flexible part; and a plurality of second uneven portions located at an inside surface of the second flexible part.

A curvature radius of the first flexible part may be less than a curvature radius of the second flexible part, and a density of the plurality of first uneven portions may be greater than a density of the plurality of second uneven portions.

The support substrate may include a third region overlapping the first portion and a fourth region overlapping the second portion and spaced apart from the third region.

The plurality of first uneven portions or the plurality of through holes may be exposed through a space between the third region and the fourth region.

The display apparatus may further include: a barrier layer on the flexible substrate and in contact with the flexible substrate; and an additional flexible substrate on the barrier layer and in contact with the barrier layer.

The flexible substrate and the additional flexible substrate may include same material, and a thickness of the flexible substrate and a thickness of the additional flexible substrate may be different from each other.

Each of the plurality of first uneven portions may have a semicylindrical shape extending along the first bending axis.

The flexible substrate may include the plurality of first uneven portions located at the inside surface of the first flexible part and a plurality of top uneven portions located at an outside surface of the first flexible part and corresponding to the plurality of first uneven portions.

According to one or more embodiments, a method of manufacturing a display apparatus includes: preparing a carrier substrate including a plurality of uneven portions; applying an organic material on the carrier substrate; curing the organic material to form a flexible substrate including a plurality of through holes or a plurality of first uneven portions located at a surface contacting the carrier substrate; forming a display unit on/over the flexible substrate; removing the carrier substrate; and bending the flexible substrate around a first bending axis in a first flexible part such that the plurality of first uneven portions or the plurality of through holes are located at an inside surface of the first flexible part.

The flexible substrate may include a first portion and a second portion on both sides of the first flexible part, the forming of the display unit may include forming the display unit on/over a top surface of at least the first portion of the flexible substrate, and the bending of the flexible substrate may include bending the flexible substrate such that a rear surface of the first portion and a rear surface of the second portion face each other.

The method may further include, after the removing of the carrier substrate, attaching a support substrate to the flexible substrate by using an adhesive layer.

The support substrate may include a third region overlapping the first portion and a fourth region overlapping the second portion and spaced apart from the third region, and the plurality of first uneven portions or the plurality of through holes may be exposed through a space between the third region and the fourth region.

Each of the plurality of first uneven portions may include a convex portion having a semicylindrical shape, and the bending of the flexible substrate may include bending the flexible substrate around the first bending axis extending in a direction parallel to an extending direction of the convex portion.

Each of the plurality of uneven portions in the carrier substrate may include a convex portion and a concave portion, the organic material applied on the convex portion and the organic material applied on the concave portion may be separated from each other, and the forming of the flexible substrate may include forming the flexible substrate including the plurality of through holes.

The method may further include, after the removing of the carrier substrate, bending the flexible substrate around a second bending axis in a second flexible part such that a plurality of second uneven portions are located at an inside surface of the second flexible part.

A curvature radius of the first flexible part may be less than a curvature radius of the second flexible part, and a density of the plurality of first uneven portions may be greater than a density of the plurality of second uneven portions.

One or more embodiments may be related to a display apparatus. The display device may include a first support substrate, a flexible substrate, and a display unit. The flexible substrate may overlap the first support substrate and may include a first portion, a second portion, and a first flexible part located between the first portion and the second portion. The first flexible part may include a first uneven surface. The first uneven surface may include at least one of a plurality of protrusions, a plurality of recesses, and a plurality of openings of through holes. The display unit may overlap the first portion.

A face of the first portion may face a face of the second portion and may be connected through the first uneven surface to the face of the second portion.

The display may include a pad and a plurality of conductors. The pad may be positioned on the second portion. The conductors may be electrically connected to the pad and may extend to the first portion and/or the first flexible part.

The openings of through holes may be located between the conductors in a plan view of the display apparatus.

The first portion may include a second flexible part. The second flexible part may include a second uneven surface.

A minimum curvature radius of the first flexible part may be less than a minimum curvature radius of the second flexible part when both the first flexible part and the second flexible part are bent. A density of protrusions or holes of the first uneven surface may be greater than a density of protrusions or holes of the second uneven surface.

The display apparatus may include a second support substrate. The second support substrate may overlap the second portion and may be spaced from the first support substrate.

The first uneven surface may be exposed through a space between the first support substrate and the second support substrate.

The display apparatus may include a barrier layer and a flexible layer. The barrier layer may be positioned on the flexible substrate. A first face of the barrier layer may be in direct contact with an opposite surface of the flexible substrate. The opposite face of the flexible substrate may be opposite the first uneven surface. The flexible layer may be positioned on the barrier layer and may be in direct contact with a second face of the barrier layer. The second face of the barrier layer may be opposite the first face of the barrier layer.

A material of the flexible substrate may be identical to a material of the flexible layer. A thickness of the flexible substrate may be unequal to a thickness of the additional flexible substrate.

The first uneven surface may include protrusions (e.g., semicylindrical protrusions) each extending parallel to a boundary between the first portion and the first flexible part.

The first uneven surface may include the plurality of protrusions. The first flexible part may include a second uneven surface. The second uneven surface may be opposite the first uneven surface and may include a plurality of recesses. The recesses may respectively correspond to the protrusions.

One or more embodiments may be related to a method for manufacturing a display apparatus. The method may include the following steps: preparing a carrier substrate; applying an organic material set on the carrier substrate; curing the organic material set to form a flexible substrate that includes a first portion, a second portion, and a first flexible part between the first portion and the second portion, wherein the first flexible part may include a first uneven surface, and wherein the uneven surface may include at least one of a plurality openings of through holes, a plurality of protrusions, and a plurality of recesses and may directly contact the carrier substrate; forming a display unit overlapping the first portion; and removing the carrier substrate.

The method may include bending the flexible part such that a face of the first portion and a face of the second portion face each other. The face of the first portion may be connected through the first uneven surface to the face of the second portion.

The method may include, after the removing of the carrier substrate, attaching a first support substrate to the first portion using an adhesive layer.

The method may include attaching a second support substrate to the second portion. The first uneven surface may be exposed through a space between the first support substrate and the second support substrate.

The method may include bending the flexible substrate around a boundary between the first flexible part and the first portion. The boundary may extend parallel to an extending direction of each of the protrusions.

The carrier substrate may include a plurality of concave portions. A first subset of the organic material set may be applied on the carrier substrate outside the concave portions. A second subset of the organic material set may be applied into the concave portions and may be separated from the first subset of the organic material set (with no organic material being connected between the first subset of the organic material set and the second subset of the organic material set). The flexible part may include the through holes.

The method may include forming a second flexible part when forming the first flexible part. The second flexible part may include a second uneven surface and may be connected through the first portion to the first flexible part.

The first uneven surface may include a plurality of first-type protrusions. The second uneven surface may include a plurality of second-type protrusions. Each first-type protrusion of the first-type protrusions may be smaller than each second-type protrusion of the second-type protrusions.

DETAILED DESCRIPTION

Figure 1:
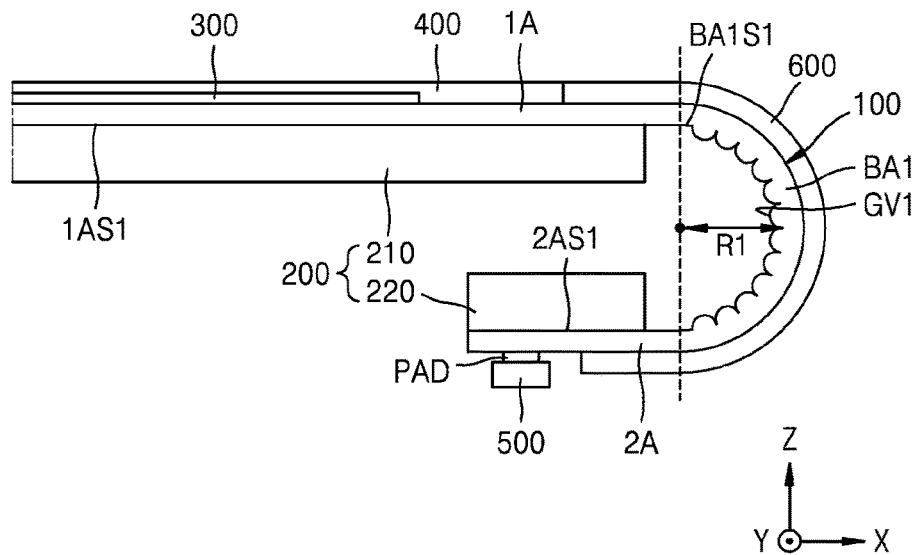
FIG. 1 is a cross-sectional view schematically illustrating a display apparatus according to an embodiment.

Example embodiments are described with reference to the accompanying drawings, wherein like reference numerals may refer to like elements.

Practical embodiments are not limited to the described embodiments and may be embodied in various modes.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

It will be understood that when a first component (such as a layer, a film, a region, or a plate) is referred to as being "on" a second component, the first component may be directly or indirectly formed/positioned on the second component. That is, for example, one or more intervening components may be present.

In the described embodiments, the x-axis, the y-axis and the z-axis are not limited to three axes of the rectangular coordinate system. For example, the x-axis, the y-axis, and the z-axis may be perpendicular to one another, or may represent different directions that are not perpendicular to one another. In this application, the term "an organic material" may mean "a set of organic material" or "an organic material set".

Figure 2:
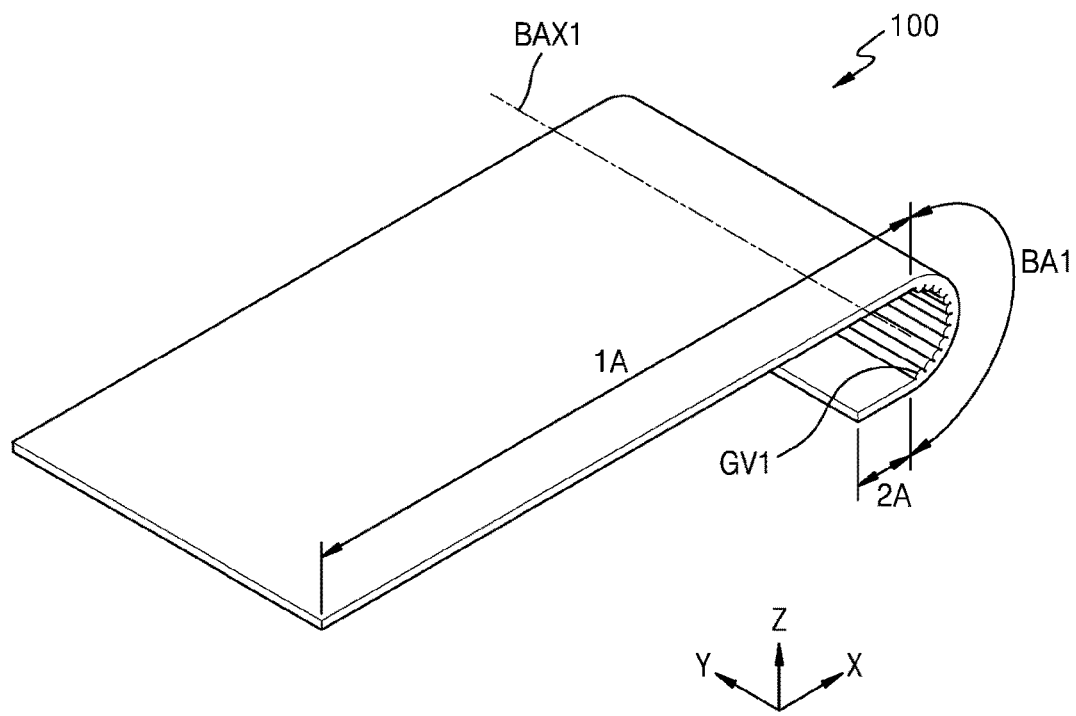
FIG. 2 is a perspective view schematically illustrating a flexible substrate in the display apparatus of FIG. 1 according to an embodiment.
Figure 3:
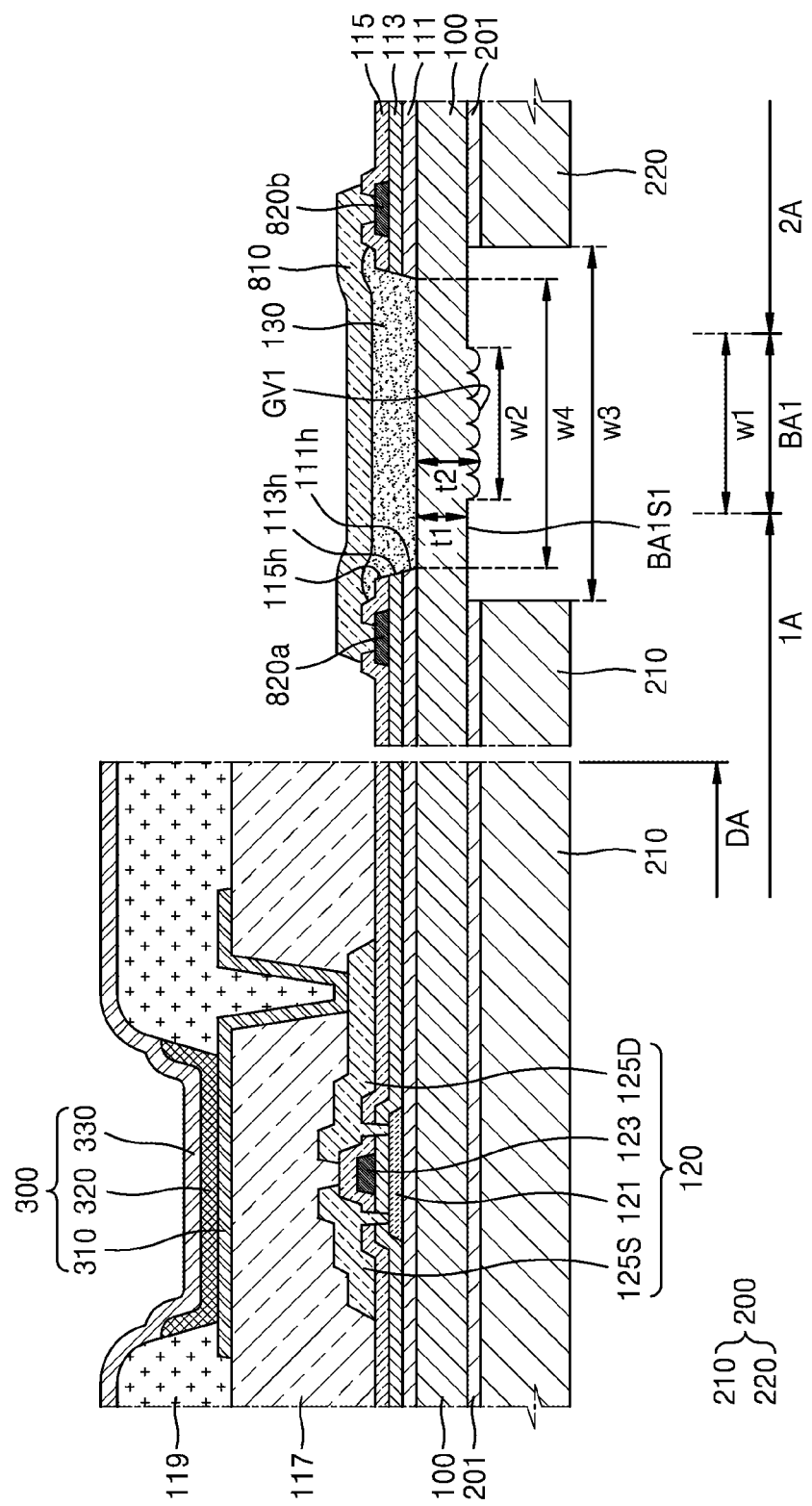
FIG. 3 is a cross-sectional view schematically illustrating a portion of the display apparatus of FIG. 1 according to an embodiment.

FIG. 1 is a cross-sectional view schematically illustrating a display apparatus according to an embodiment. FIG. 2 is a perspective view schematically illustrating a flexible substrate in the display apparatus of FIG. 1. FIG. 3 is a cross-sectional view schematically illustrating a portion of the display apparatus of FIG. 1.

As illustrated in FIGS. 1 and 2, the display apparatus includes a flexible substrate 100. A portion of the flexible substrate 100 may be bent and thus a portion of the display apparatus may have a bent shape like the flexible substrate 100. The display apparatus may also be in an unbent state illustrated in FIG. 3.

Referring to FIGS. 1 to 3, the display apparatus may include a support substrate 200; the flexible substrate 100 disposed on/over the support substrate 200, the flexible substrate including a first flexible part BA1 between a first portion 1A and a second portion 2A to be bent around a first bending axis BAX1 in the first flexible part BA1 (and/or around a boundary between BA1 and 1A) and a plurality of first uneven portions GV1 located at an inside surface BA1S1 of the first flexible part BA1; and a display unit 300 disposed on/over at least the first portion 1A of the flexible substrate 100.

The first flexible part BA1 extends in a first direction (+y direction). The first flexible part BA1 is located between the first portion 1A and the second portion 2A. The second portion 2A extends in a second direction (+x direction) intersecting the first direction. Also, as illustrated in FIG. 2, the flexible substrate 100 is bent around the first bending axis BAX1 (and/or a boundary between BA1 and 1A) extending in the first direction (+y direction). The flexible substrate 100 may include various materials. For example, the flexible substrate 100 may include polymer resin such as polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). According to an embodiment, the flexible substrate 100 may include polyimide (PI) having excellent bendable characteristics and may have a thickness in a range of several micrometers (μm) to tens of μm.

The first portion 1A includes a display region DA. Also, in addition to the display region DA, the first portion 1A may include a portion of a non-display region outside the display region DA as illustrated in FIG. 3. Also, if necessary, the display region DA may extend to a flexible part BA. The second portion 2A may also include a non-display region.

In addition to the display unit 300, a thin film transistor 120, electrically connected to the display unit 300, may be located in the display region DA of the flexible substrate 100 as illustrated in FIG. 2. FIG. 3 illustrates that an organic light-emitting device as the display unit 300 is located in the display region DA. The organic light-emitting device electrically connected to the thin film transistor 120 may be construed as a pixel electrode 310 electrically connected to the thin film transistor 120. Also, if necessary, a thin film transistor (not illustrated) may be disposed in a peripheral region outside the display region DA. The thin film transistor located in the peripheral region may be, for example, a portion of a circuit unit for controlling an electrical signal applied in the display region DA.

The thin film transistor 120 may include an active layer 121, including amorphous silicon, polycrystalline silicon, or an organic semiconductor material, a gate electrode 123, a source electrode 125S, and a drain electrode 125D. For insulation between the active layer 121 and the gate electrode 123, a gate insulating layer 113 including inorganic material such as silicon oxide, silicon nitride, and/or silicon oxynitride may be interposed between the active layer 121 and the gate electrode 123. In addition, an interlayer insulating layer 115 including an inorganic material such as silicon oxide, silicon nitride, and/or silicon oxynitride may be disposed on/over the gate electrode 123, and the source electrode 125S and the drain electrode 125D may be disposed on the interlayer insulating layer 115. The insulating layer including the inorganic material may be formed by chemical vapor deposition (CVD) or atomic layer deposition (ALD). The insulating layer in the following embodiments and modifications thereof may be formed in the same manner.

A buffer layer 111 including an inorganic material such as silicon oxide, silicon nitride, and/or silicon oxynitride may be interposed between the flexible substrate 100 and the thin film transistor 120. According to an embodiment, the buffer layer 111 may increase smoothness of a top surface of the flexible substrate 100 or may prevent or minimize permeation of impurities from the flexible substrate 100 into the active layer 121 of the thin film transistor 120.

Also, a planarization layer 117 may be disposed on the thin film transistor 120. According to an embodiment, as illustrated in FIG. 3, when an organic light-emitting device is disposed on/over the thin film transistor 120, the planarization layer 117 may substantially planarize a top portion of a protection layer covering the thin film transistor 120. The planarization layer 117 may include, for example, an organic material such as acryl, polyimide, benzocyclobutene (BCB), or hexamethyldisiloxane (HMDSO). Although each of the buffer layer 111, the gate insulating layer 113, the interlayer insulating layer 115, and the planarization layer 117 is illustrated as a single layer in FIG. 3. In an embodiment, one or more of the buffer layer 111, the gate insulating layer 113, the interlayer insulating layer 115, and the planarization layer 117 may include multiple layers.

Also, as illustrated in FIG. 3, the planarization layer 117 may not cover the entire first portion 1A of the flexible substrate 100. In an embodiment, an end portion (not illustrated) of the planarization layer 117 may be disposed in a non-display region between the display region DA and the first flexible part BA1 to prevent the permeation of impurities such as external moisture or oxygen into the display region DA through the planarization layer 117.

In the display region DA of the flexible substrate 100, an organic light-emitting device including a pixel electrode 310, an opposite electrode 330, and an intermediate layer 320 interposed between the electrodes 310 and 330 and including a light-emitting layer may be located on the planarization layer 117. For example, as illustrated in FIG. 3, the pixel electrode 310 is electrically connected to the thin film transistor 120 by contacting any one of the source electrode 125S and the drain electrode 125D through an opening portion formed in the planarization layer 117.

A pixel definition layer 119 may be disposed on/over the planarization layer 117. The pixel definition layer 119 may define a pixel by having an opening corresponding to subpixels, that is, an opening formed to expose at least a center portion of the pixel electrode 310. Also, for example, in the case illustrated in FIG. 3, the pixel definition layer 119 may prevent the occurrence of an arc at the edge of the pixel electrode 310 by increasing the distance between the edge of the pixel electrode 310 and the opposite electrode 330 located over the pixel electrode 310. The pixel definition layer 119 may include, for example, organic material such as polyimide or hexamethyldisiloxane (HMDSO).

The pixel electrode 310 may be a reflection electrode including a reflective layer. For example, the reflective layer may include at least one of silver (Ag), magnesium (Mg), aluminum (Al), platinum (Pt), palladium (Pd), gold (Au), nickel (Ni), neodymium (Nd), iridium (Ir), and chromium (Cr); and a transparent or translucent electrode layer including at least one of indium tin oxide (ITO), indium zinc oxide (IZO), zinc oxide (ZnO), indium oxide ($In_2O_3$), indium gallium oxide (IGO), and aluminum zinc oxide (AZO) may be further disposed on the reflective layer.

According to an embodiment, the pixel electrode 310 may include three layers of ITO/Ag/ITO.

The intermediate layer 320 of the organic light-emitting device may include an organic light-emitting layer and may further include at least one of a hole injection layer (HIL), a hole transport layer (HTL), an electron transport layer (ETL), and an electron injection layer (EIL). In an embodiment, the intermediate layer 320 may further include various other functional layers.

The intermediate layer 320 may have one or more of various structures. Also, the intermediate layer 320 may include a layer integrated across a plurality of pixel electrodes 310 or may include a layer patterned to correspond to each of a plurality of pixel electrodes 310.

Also, the organic light-emitting layer may have a multi-layer structure including a red light-emitting layer, a green light-emitting layer, and a blue light-emitting layer stacked to emit a white light or may have a single-layer structure including a red light-emitting material, a green light-emitting material, and a blue light-emitting material. The organic light-emitting device including the organic light-emitting layer may emit full-color lights by additionally including a red color filter, a green color filter, and a blue color filter.

The opposite electrode 330 may be a transparent (or translucent) electrode. For example, the opposite electrode 330 may include at least one of silver (Ag), aluminum (Al), magnesium (Mg), lithium (Li), calcium (Ca), copper (Cu), LiF/Ca, LiF/Al, MgAg, and CaAg, and may be formed of a thin film with a thickness in a range of several nanometers (nm) to tens of nm to transmit lights.

Although not illustrated in FIG. 3 and in reference to FIG. 1, an encapsulation layer 400 may be disposed on the display unit 300 to cover the display unit 300. The encapsulation layer 400 may protect the display unit 300 from impurities such as external moisture or oxygen. This will be described later.

The flexible substrate 100 may be bent around the first bending axis BAX1 in the first flexible part BA1 and may include the plurality of first uneven portions GV1 located at the inside surface BA1S1 of the first flexible part BA1. Herein, the inside surface BA1S1 is the surface facing the first bending axis BAX1 among two opposite surfaces of the flexible substrate 100. According to an embodiment, as illustrated in FIG. 2, the plurality of first uneven portions GV1 may have a semicylindrical shape extending in the first direction (+y direction) while protruding from a flat surface where the first uneven portion GV1 is not formed. FIG. 2 illustrates that the first uneven portions GV1 have the same size and shape. In an embodiment, the plurality of first uneven portions GV1 may not have the same size and/or shape. In an embodiment, a thickness t2 of the flexible substrate 100 in the region having the largest thickness among the regions where the plurality of first uneven portions GV1 are formed may be greater than a thickness t1 of the flexible substrate 100 in the region where the first uneven portion GV1 is not formed. A deviation of the plurality of first uneven portions GV1 may have a high uniformity of 10% or less based on the height of the first uneven portion GV1, and a roughness of the plurality of first uneven portions GV1 may have a low value of 50 nm or less.

In an embodiment, the first uneven portion GV1 may have a concave shape with respect to a flat surface and may have various shapes such as a hemispherical shape and a shape having a trapezoidal cross section and extending in the first direction (+y direction). FIG. 3 illustrates that the first uneven portion GV1 is located at the inside surface BA1S1 of the first flexible part BA1 and the top surface of the first flexible part BA1 is flat. In an embodiment, the top surface of the first flexible part BA1 may include an uneven portion corresponding to the first uneven portion GV1.

According to an embodiment, the first uneven portion GV1 may be located only at a portion of the first flexible part BA1. In an embodiment, a width w2 of the region where the first uneven portion GV1 is formed may be less than a width w1 of the first flexible part BA1. In an embodiment, the width w2 of the region where the first uneven portion GV1 is formed may be equal to or greater than the width w1 of the first flexible part BA1.

The support substrate 200 may be disposed under a bottom side of the flexible substrate 100. Herein, the bottom side of the flexible substrate 100 is a side opposite to the side where the display unit 300 is disposed. Hereinafter, the surface of the flexible substrate 100 where the support substrate 200 is disposed will be referred to as a rear surface, and the surface of the flexible substrate 100 where the display unit 300 is disposed will be referred to as a top surface. In an embodiment, the flexible substrate 100 may include a rear surface 1AS1 of the first portion 1A, a rear surface 2AS1 of the second portion 2A, and the inside surface BA1S1 of the first flexible part BA1 disposed between the rear surface 1AS1 and the rear surface 2AS1 to connect the rear surface 1AS1 and the rear surface 2AS1, and the rear surface 1AS1 of the first portion 1A and the rear surface 2AS1 of the second portion 2A may be disposed to face each other.

The support substrate 200 may include a third region 210 disposed at the rear surface 1AS1 of the first portion 1A of the flexible substrate 100 and a fourth region 220 disposed at the rear surface 2AS1 of the second portion 2A of the flexible substrate 100, and the third region 210 and the fourth region 220 may be disposed to be completely separated from each other. In an embodiment, the support substrate 200 may not be disposed in the first flexible part BA1, and the plurality of first uneven portions GV1 located at the inside surface BA1S1 of the first flexible part BA1 may be exposed through a space between the third region 210 and the fourth region 220. According to an embodiment, the support substrate 200 may not be disposed at a portion of the first portion 1A and a portion of the second portion 2A as well as in the first flexible part BA1. In an embodiment, a width w3 of the space between the third region 210 and the fourth region 220 may be larger than the width w1 of the first flexible part BA1.

The support substrate 200 may have a higher stiffness than the flexible substrate 100. For example, the support substrate 200 may include polymer resin such as polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). According to an embodiment, the support substrate 200 may include polyethylene naphthalate (PEN) and may have a greater thickness than the flexible substrate 100 including polyimide (PI).

An adhesive layer 201 may be disposed between the support substrate 200 and the flexible substrate 100. As will be described later, the display unit 300 is formed on/over the flexible substrate 100, and then the support substrate 200 is formed at the rear surface of the flexible substrate 100 through a subsequent process. For example, the support substrate 200 may be attached to the rear surface of the flexible substrate 100 by using the adhesive layer 201.

According to an embodiment, the display apparatus may be made robust by disposing the support substrate 200 under the flexible substrate 100 having a high flexibility, and the flexibility of the display apparatus may be improved by not disposing the support substrate 200 in the first flexible part BA1. Also, the flexibility of the display apparatus may be further improved by forming the plurality of first uneven portions GV1 in the first flexible part BA1 of the flexible substrate 100. In an embodiment, the flexible substrate 100 may be formed of a high-flexibility material such as polyimide. According to an embodiment, a carrier substrate 900 (see FIG. 19A) may be processed to have a shape corresponding to uneven portions or through holes to be formed at the flexible substrate 100, and then the carrier substrate 900 (see FIG. 19A) may be used to easily form the uneven portions or through holes at the flexible substrate 100.

The buffer layer 111, the gate insulating layer 113, and the interlayer insulating layer 115 disposed in the display region DA have an opening corresponding to the first flexible part BA1 as illustrated in FIG. 3. In an embodiment, the buffer layer 111, the gate insulating layer 113, and the interlayer insulating layer 115 may respectively have openings 111h, 113h, and 115h corresponding to the first flexible part BA1. In an embodiment, the buffer layer 111, the gate insulating layer 113, and the interlayer insulating layer 115 may be collectively referred to as an inorganic insulating layer, and the inorganic insulating layer may have an opening corresponding to the first flexible part BA1. The opening corresponding to the first flexible part BA1 may be positioned over and/or overlap the first flexible part BA1. In an embodiment, the area of the opening may be larger than the area of the first flexible part BA1. Thus, FIG. 3 illustrates that a width w4 of the opening is larger than the width w1 of the first flexible part BA1. Herein, the width w4 of the opening may be defined as the width of the opening having the smallest area among the openings 111h, 113h, and 115h of the buffer layer 111, the gate insulating layer 113, and the interlayer insulating layer 115, and FIG. 3 illustrates that the width w4 of the opening is defined by the width of the opening 111h of the buffer layer 111.

According to an embodiment, the display apparatus may include an organic layer 130 filling at least a portion of the opening of the inorganic insulating layer, and a conductive layer 810 may be disposed on the organic layer 130. The conductive layer 810 may extend from the first portion 1A through the first flexible part BA1 to the second portion 2A, and may be formed of the same material and disposed in the same layer as the source electrode 125S and the drain electrode 125D. A pad portion PAD may be located on/in the second portion 2A, and an integrated circuit chip 500 or a printed circuit board (not illustrated) may be electrically connected to the pad portion PAD.

When an inorganic insulating layer such as the buffer layer 111, the gate insulating layer 113, and/or the interlayer insulating layer 115 does not have an opening in the first flexible part BA1 and thus has a continuous shape from the first portion 1A to the second portion 2A and the conductive layer 810 is located on the inorganic insulating layer, a large tensile stress is applied to the conductive layer 810 in the process of bending the flexible substrate 100. In particular, since the inorganic insulating layer has a higher hardness than the organic layer 130, there is a very high probability that a crack or the like will occur in the inorganic insulating layer in the first flexible part BA1; and when a crack occurs in the inorganic insulating layer, there is a very high probability that a crack or the like will occur also in the conductive layer 810 on the inorganic insulating layer and thus a failure such as disconnection will occur in the conductive layer 810.

However, in an embodiment, as described above, the inorganic insulating layer has an opening in the first flexible part BA1, and a portion of the first flexible part BA1 of the conductive layer 810 is located on the organic layer 130 filling at least a portion of the opening of the inorganic insulating layer. Since the inorganic insulating layer has an opening in the first flexible part BA1, there is a very low probability that a crack or the like will occur in the inorganic insulating layer; and since the organic layer 130 includes an organic material, there is a low probability that a crack will occur in the organic layer 130. Thus, the organic layer 130 may prevent or minimize the occurrence of a crack or the like in a portion of the first flexible part BA1 of the conductive layer 810 located on the organic layer 130. Also, since the organic layer 130 has a lower hardness than the inorganic insulating layer, the organic layer 130 may effectively minimize the concentration of a tensile stress on the conductive layer 810 by absorbing the tensile stress generated by the bending of the flexible substrate 100.

Although not illustrated, the conductive layer 810 may have a plurality of holes (not illustrated) formed in a portion corresponding to at least the first flexible part BA1, thereby effectively preventing or reducing the damage to the conductive layer 810.

The conductive layer 810 may be electrically connected to the pad portion PAD to extend from the pad portion PAD to the first flexible part BA1 or the first portion 1A, and may be, for example, a connection line that is electrically connected to a data line, a scan line, and a touch electrode disposed in the display region DA. According to an embodiment, in addition to the conductive layer 810, the display apparatus may further include additional conductive layers 820a and 820b that are disposed in the first portion 1A or the second portion 2A to be located in a different layer from the conductive layer 810. For example, the additional conductive layer 820a located in the first portion 1A may be electrically connected to a thin film transistor in the display region DA, and the additional conductive layer 820b located in the second portion 2A may be electrically connected to the pad portion PAD.

FIG. 3 illustrates that the additional conductive layers 820a and 820b are formed of the same material and located in the same layer as the gate electrode 123 of the thin film transistor 120, and contact the conductive layer 810 through a contact hole formed in the interlayer insulating layer 115. In an embodiment, the conductive layer 810 may electrically connect the additional conductive layer 820a located in the first portion 1A and the additional conductive layer 820b located in the second portion 2A. The conductive layer 810 may include a higher-elongation material than the additional conductive layer 820b. By electrically connecting the additional conductive layers 820a and 820b by the conductive layer 810 without disposing the additional conductive layers 820a and 820b in the first flexible part BA1, a conductive layer including a low-elongation material may be prevented from being damaged by a tensile stress by being disposed in the first flexible part BA1.

For example, the additional conductive layers 820a and 820b may include molybdenum, and the conductive layer 810 may include aluminum. Also, if necessary, the conductive layer 810 and/or the additional conductive layers 820a and 820b may have a multi-layer structure. Although not illustrated, a plurality of conductive layers 810 may be provided and at least some of the plurality of conductive layers 810 may not be electrically connected to the additional conductive layers 820a and 820b.

Although not illustrated in FIG. 3, referring to FIG. 1, a bending protection layer (BPL) 600 may be disposed on/over the conductive layer 810 to cover the first flexible part BA1 of the flexible substrate 100. When a stack structure is bent, a stress neutral plane exists in the stack structure. For example, when the bending protection layer 600 is not provided, an excessive tensile stress may be applied to the conductive layer 810 in the first flexible part BA1 according to the bending of the flexible substrate 100. This is because the position of the conductive layer 810 may not correspond to the stress neutral plane. However, by providing the bending protection layer 600 and adjusting the thickness and modulus thereof, the position of the stress neutral plane may be adjusted in a stack structure including the flexible substrate 100, the conductive layer 810, and the bending protection layer 600. Thus, the tensile stress applied to the conductive layer 810 may be minimized by locating the stress neutral plane near the conductive layer 810 through the bending protection layer 600.

FIGS. 4 to 13 are cross-sectional views schematically illustrating a portion of a display apparatus according to embodiments.

Portions other than the portion of the display apparatus illustrated in FIGS. 4 to 13 may be the same as those of the display apparatus illustrated in FIG. 3, and differences with FIG. 3 will be described below focusing on the first flexible part BA1 of the display apparatus illustrated in FIGS. 4 to 13.

Figure 4:
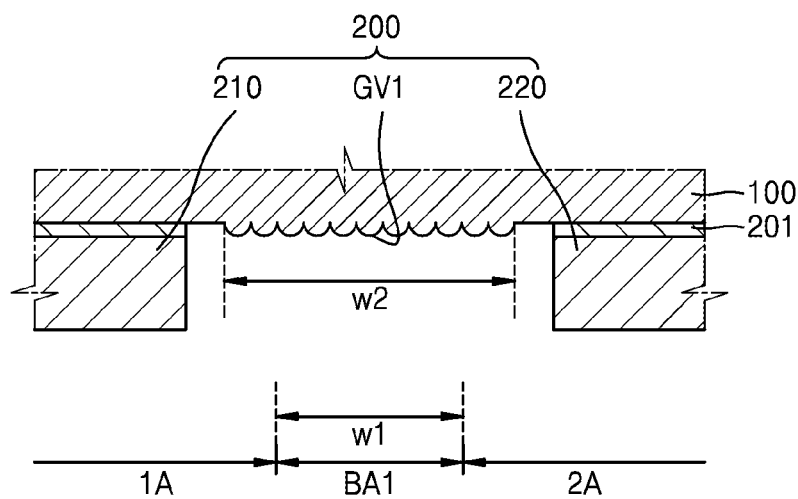
FIG. 4 is a cross-sectional view schematically illustrating a portion of a display apparatus according to an embodiment.

Referring to FIG. 4, an inside surface BA1 of a first flexible part BA1 may include a plurality of first uneven portions GV1, and a width w2 of the region where the first uneven portion GV1 is formed may be larger than a width w1 of the first flexible part BA1. In an embodiment, the first uneven portion GV1 may be located not only in the first flexible part BA1 but also in a portion of a first portion 1A and/or a second portion 2A adjacent to the first flexible part BA1.

Figure 5:
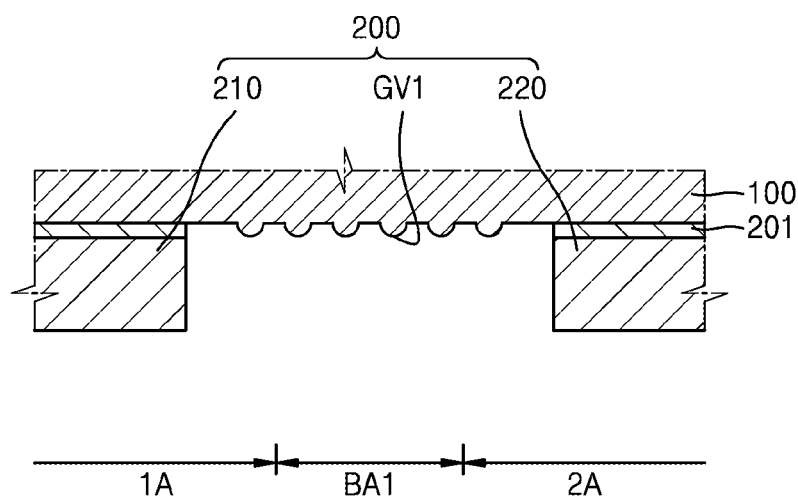
FIG. 5 is a cross-sectional view schematically illustrating a portion of a display apparatus according to an embodiment.

The shape of the first uneven portion GV1 may be the same as illustrated in FIG. 5. In an embodiment, the first uneven portion GV1 may include a convex portion and a flat region disposed between adjacent convex portions.

Figure 6:
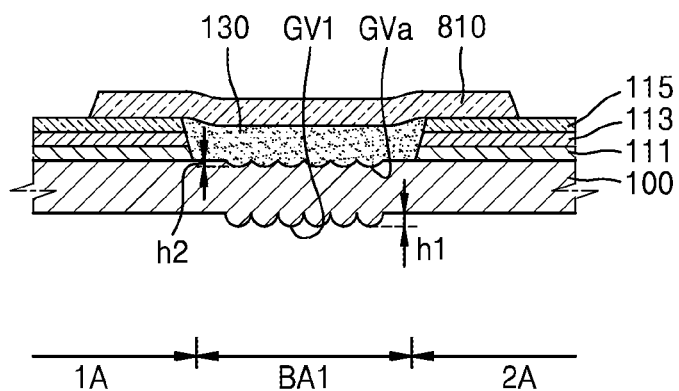
FIG. 6 is a cross-sectional view schematically illustrating a portion of a display apparatus according to an embodiment.

Referring to FIG. 6, a flexible substrate 100 may include a plurality of first uneven portions GV1 located at an inside surface of a first flexible part BA1, and an outside surface opposite to an inside surface of the flexible substrate 100 may also include a plurality of top uneven portions GVa (e.g., protrusions and/or recesses) corresponding to the plurality of first uneven portions GV1. The plurality of top uneven portions GVa located at the outside surface may have a shape corresponding to the plurality of first uneven portions GV1, and a height h2 of each of the plurality of top uneven portions GVa may be smaller than a height h1 of the first uneven portion GV1.

Figure 7:
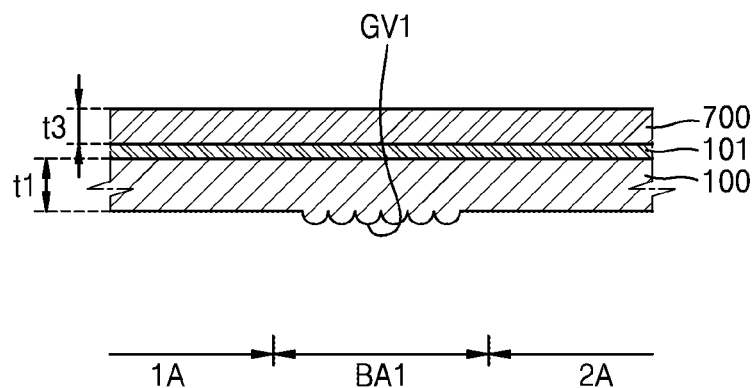
FIG. 7 is a cross-sectional view schematically illustrating a portion of a display apparatus according to an embodiment.
Figure 8:
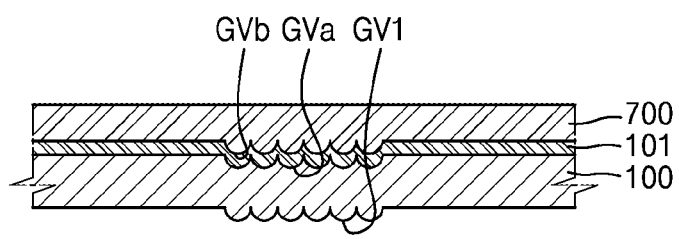
FIG. 8 is a cross-sectional view schematically illustrating a portion of a display apparatus according to an embodiment.
Figure 9:
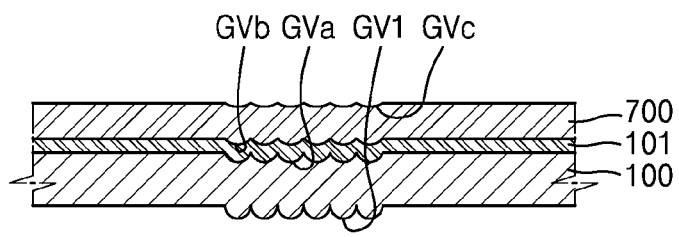
FIG. 9 is a cross-sectional view schematically illustrating a portion of a display apparatus according to an embodiment.

Referring to FIGS. 7 to 9, a plurality of first uneven portions GV1 may be located at an inside surface of a first flexible part BA1 of a flexible substrate 100, and a first barrier layer 101 disposed to contact the flexible substrate 100 and an additional flexible substrate 700 disposed to contact the first barrier layer 101 may be disposed on the flexible substrate 100. The additional flexible substrate 700 may include the same material as the flexible substrate 100; for example, the flexible substrate 100 and the additional flexible substrate 700 may include polyimide.

According to an embodiment, a thickness t1 of a flat region of the flexible substrate 100 may be larger than a thickness t3 of the additional flexible substrate 700. The first barrier layer 101 may include inorganic material such as silicon oxide, silicon nitride, and/or silicon oxynitride, and may prevent or reduce the permeation of impurities from the flexible substrate 100 into the additional flexible substrate 700.

A plurality of first uneven portions GV1 may be disposed at an inside surface of the flexible substrate 100, and an outside surface of the flexible substrate 100 may be flat as illustrated in FIG. 7 or may include a plurality of top uneven portions GVa corresponding to the plurality of first uneven portions GV1 as illustrated in FIGS. 8 and 9. When the outside surface of the flexible substrate 100 includes a plurality of uneven portions GVa, the surface of the first barrier layer 101 contacting the flexible substrate 100 may include a plurality of uneven portions and the interface between the first barrier layer 101 and the additional flexible substrate 700 may also include a plurality of uneven portions GVb. The opposite surface opposite to the surface of the additional flexible substrate 700 contacting the first barrier layer 101 may be flat as illustrated in FIG. 8 or may include a plurality of uneven portions GVc as illustrated in FIG. 9.

Figure 10:
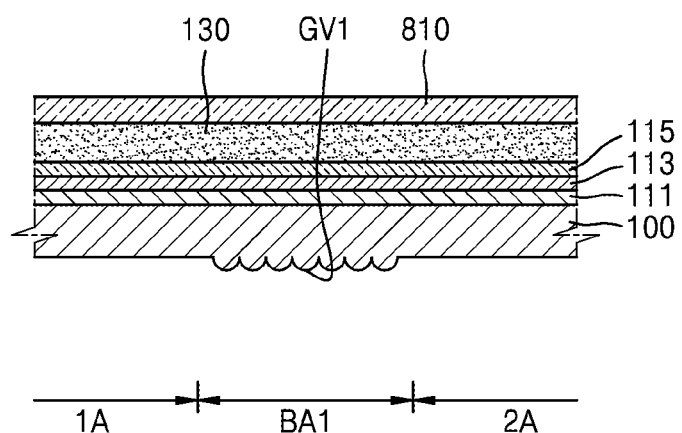
FIG. 10 is a cross-sectional view schematically illustrating a portion of a display apparatus according to an embodiment.

Referring to FIG. 10, a flexible substrate 100 may include a plurality of first uneven portions GV1 at an inside surface corresponding to a first flexible part BA1; and a buffer layer 111, a gate insulating layer 113, and an interlayer insulating layer 115 may be disposed on the flexible substrate 100. Although not illustrated, a second barrier layer (not illustrated) may be further disposed between the flexible substrate 100 and the buffer layer 111.

Unlike the illustration of FIG. 3, the buffer layer 111, the gate insulating layer 113, and the interlayer insulating layer 115 may not include an opening corresponding to the first flexible part BA1. In an embodiment, an inorganic insulating layer may be disposed also in the first flexible part BA1. An organic layer 130 may be disposed on the interlayer insulating layer 115, and a conductive layer 810 may be disposed on the organic layer 130. Although not illustrated, at least one of the buffer layer 111, the gate insulating layer 113, the interlayer insulating layer 115, the organic layer 130, and the conductive layer 810 may include a plurality of uneven portions corresponding to the plurality of first uneven portions GV1.

Figure 11:
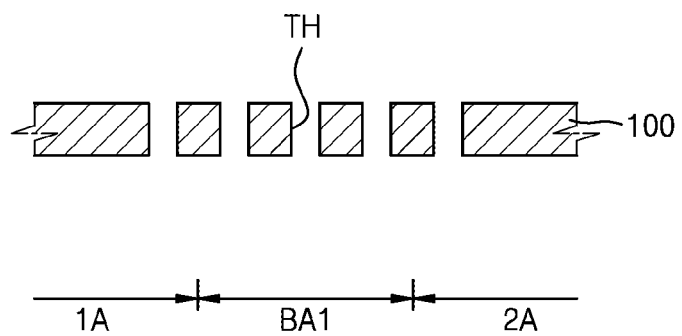
FIG. 11 is a cross-sectional view schematically illustrating a portion of a display apparatus according to an embodiment.

Referring to FIG. 11, a flexible substrate 100 may include a plurality of through holes TH located at an inside surface of a first flexible part BA1. The plurality of through holes TH may extend from an inside surface of the flexible substrate 100 to an outside surface of the flexible substrate 100 to penetrate the flexible substrate 100.

Figure 12:
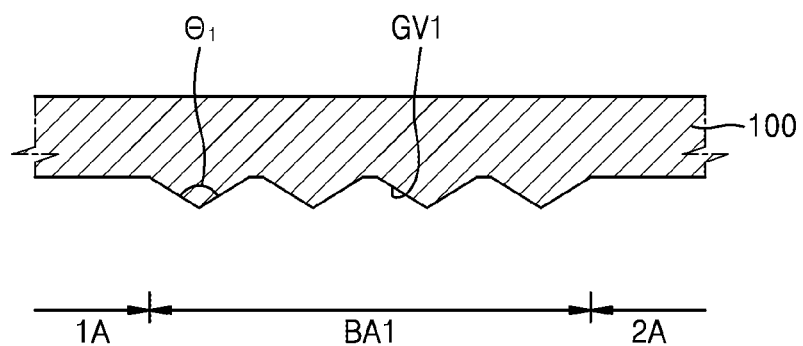
FIG. 12 is a cross-sectional view schematically illustrating a portion of a display apparatus according to an embodiment.

Referring to FIG. 12, a flexible substrate 100 may include a plurality of first uneven portions GV1 located at an inside surface of a first flexible part BA1, and a cross section of the first uneven portion GV1 may have a triangular shape. In an embodiment, an angle 81 corresponding to a vertex of the triangular shape may be about 145 degrees or more. When the angle 81 is smaller than 145 degrees, it may be difficult to separate a carrier substrate 900 (see FIG. 19A) from the flexible substrate 100. In an embodiment, in general, laser beams may be irradiated to separate the carrier substrate 900 (see FIG. 19A) from the flexible substrate 100; however, when the angle 81 is smaller than 145 degrees, a portion of the irradiated laser beams may not be properly irradiated to a desired region by being reflected by the first uneven portion GV1. Thus, a detachment failure of the carrier substrate 900 (see FIG. 19A) may be induced.

Figure 13:
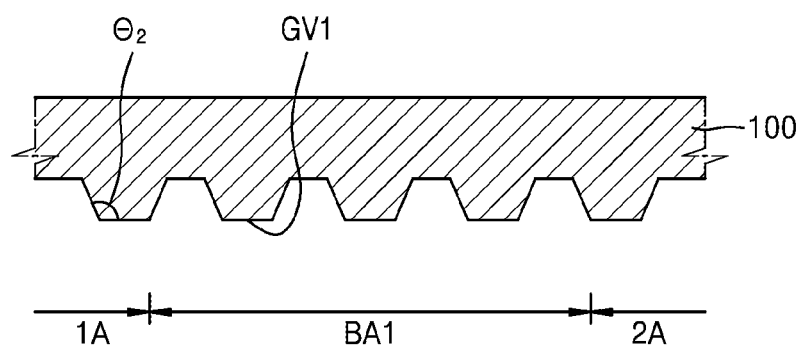
FIG. 13 is a cross-sectional view schematically illustrating a portion of a display apparatus according to an embodiment.
Figure 14:
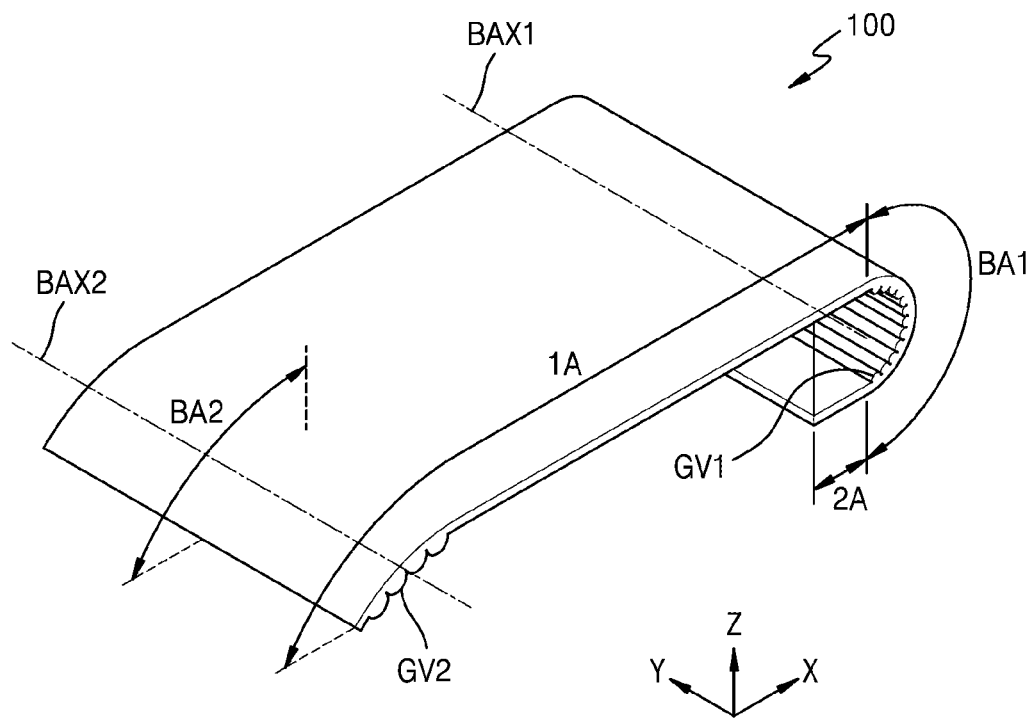
FIG. 14 is a perspective view schematically illustrating a portion of a display apparatus according to an embodiment.
Figure 15:
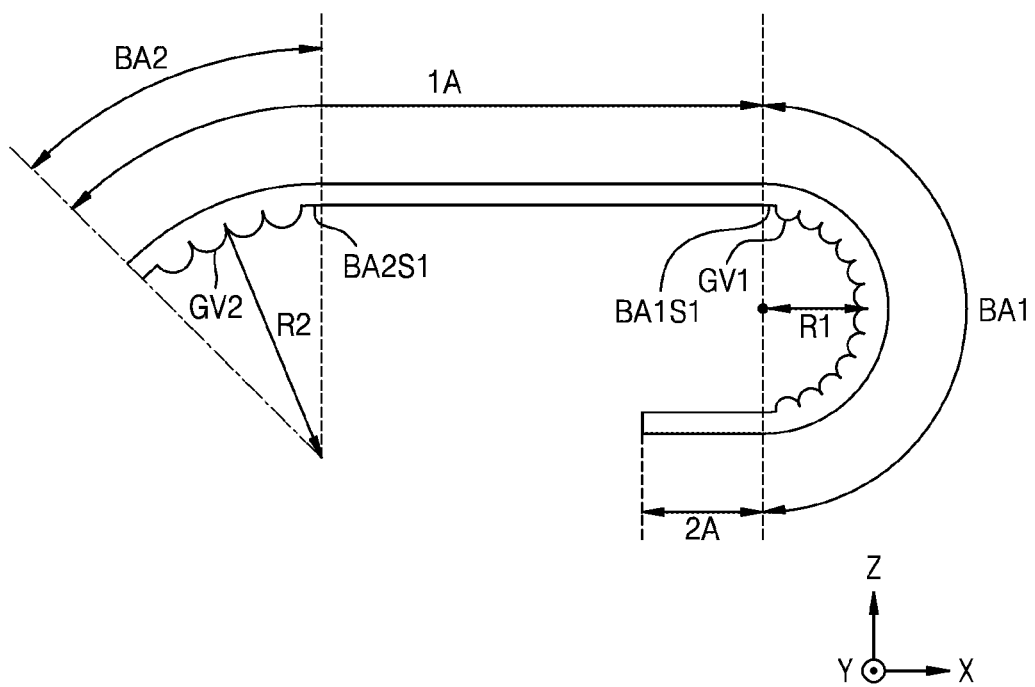
FIG. 15 is a cross-sectional view schematically illustrating a portion of the display apparatus of FIG. 14 according to an embodiment.

Referring to FIG. 13, a flexible substrate 100 may include a plurality of first uneven portions GV1 located at an inside surface of a first flexible part BA1, and a cross section of the first uneven portion GV1 may have a trapezoidal shape. In an embodiment, an angle $\theta_2$ corresponding to a vertex of the trapezoidal shape may be about 145 degrees or more. When the angle $\theta_2$ is smaller than 145 degrees, a detachment failure of the carrier substrate 900 (see FIG. 19A) may be induced as described with reference to FIG. 12. FIG. 14 is a perspective view schematically illustrating a portion of a display apparatus according to an embodiment. FIG. 15 is a cross-sectional view schematically illustrating a portion of the display apparatus of FIG. 14.

Referring to FIGS. 14 and 15, a flexible substrate 100 included in a display apparatus according to an embodiment includes a first flexible part BA1 located between a first portion 1A and a second portion 2A to be bent around a first bending axis BAX1 in the first flexible part BA1, and includes a plurality of first uneven portions GV1 located at an inside surface BA1S1 of the first flexible part BA1. In addition to the first flexible part BA1, the flexible substrate 100 may further include a second flexible part BA2 included in the first portion 1A to be bent around a second bending axis BAX2 in the second flexible part BA2.

The flexible substrate 100 may be bent in the first flexible part BA1 to have a first minimum curvature radius R1 and may be bent in the second flexible part BA2 to have a second minimum curvature radius R2, and the first minimum curvature radius R1 may be smaller than the second minimum curvature radius R2. In an embodiment, a tensile force in the first flexible part BA1 of the flexible substrate 100 may be greater than a tensile force in the second flexible part BA1.

As in the first flexible part BA1, a plurality of second uneven portions GV2 may be located at an inside surface BA2S1 of the second flexible part BA2. The plurality of second uneven portions GV2 may improve the flexibility of the flexible substrate 100, and a density of the plurality of first uneven portions GV1 may be greater than a density of the plurality of second uneven portions GV2. Herein, the density may refer to the ratio of the number of uneven portions to the area of a region where the uneven portions are located. In an embodiment, the density of first uneven portions GV1 formed in the first flexible part BA1 to which a relatively great tensile force is applied may be greater than the density of second uneven portions GV2 formed in the second flexible part BA2 to which a relatively small tensile force is applied.

According to an embodiment, the flexible substrate 100 may include a plurality of flexible parts, a plurality of uneven portions may be located at an inside surface of at least some of the plurality of flexible parts, and a plurality of uneven portions located in different flexible parts may be different in shape, density, height, and/or width.

Although FIG. 14 illustrates a case where the first bending axis BAX1 and the second bending axis BAX2 are parallel to each other, in one or more embodiments, the first bending axis BAX1 and the second bending axis BAX2 may be perpendicular to each other or may be at a predetermined angle to each other.

Figure 16:
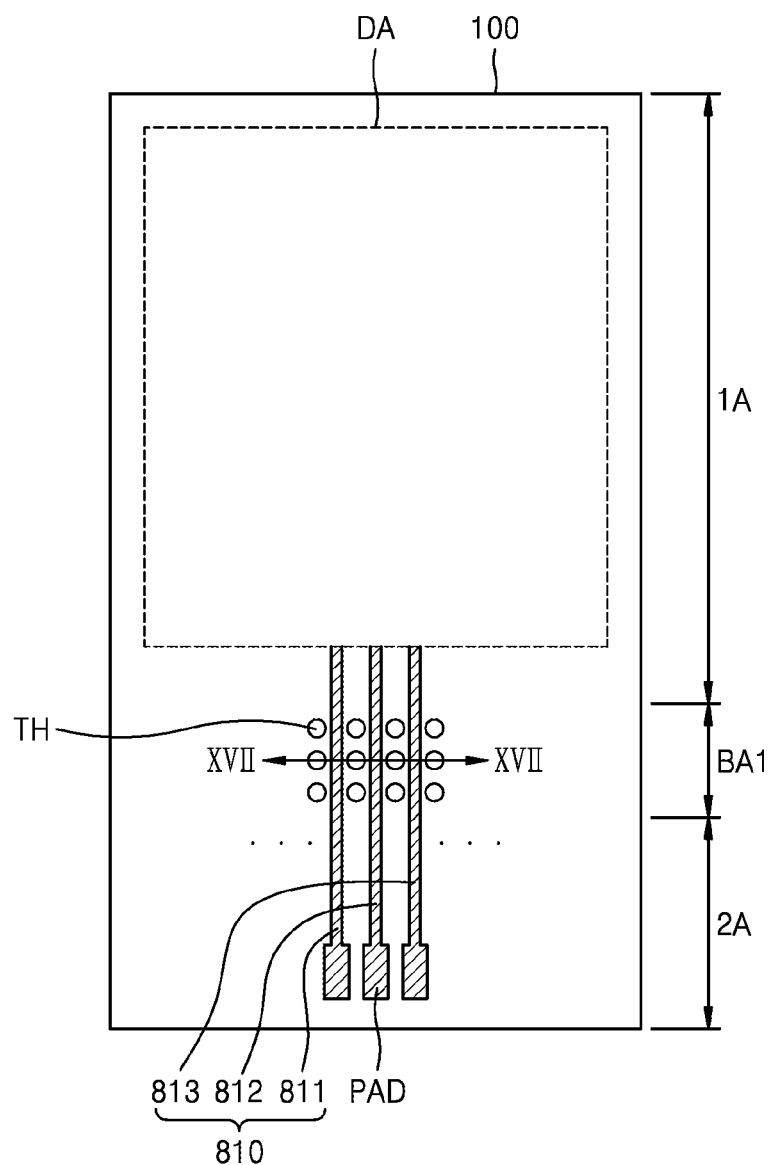
FIG. 16 is a plan view schematically illustrating a portion of a display apparatus according to an embodiment.
Figure 17:
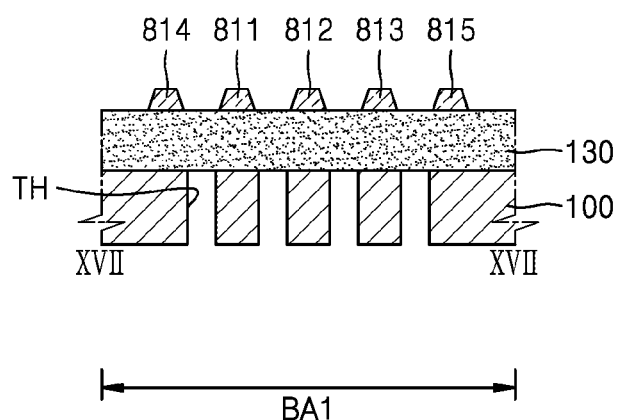
FIG. 17 is a cross-sectional view schematically illustrating a portion of a cross section taken along a XVII-XVII line of FIG. 16 according to an embodiment.

FIG. 16 is a plan view schematically illustrating a portion of a display apparatus according to an embodiment. FIG. 17 is a cross-sectional view schematically illustrating a portion of a cross section taken along a XVII-XVII line of FIG. 16.

Referring to FIGS. 16 and 17, a display apparatus according to an embodiment includes a flexible substrate 100 that includes a first flexible part BA1 located between a first portion 1A and a second portion 2A to be bent in the first flexible part BA1 and includes a plurality of through holes TH located in the first flexible part BA1. According to an embodiment, the width of the first flexible part BA1 in a direction perpendicular to a bending axis thereof may be about 0.1 mm to about 1.4 mm; for example, when the thickness of a support substrate 200 is about 100 µm, the width of the first flexible part BA1 may be about 0.3 mm. Also, the distance between adjacent through holes TH may be at least about 15 µm.

A pad portion PA may be disposed in the second portion 2A of the flexible substrate 100, and a conductive layer 810 extending from the pad portion PAD may be disposed in the first flexible part BA1. The conductive layer 810 may be a connection line that may electrically connect the pad portion PAD to various components located in the first portion 1A or the first flexible part BA1. For example, the conductive layer 810 may electrically connect the pad portion PAD to a display unit in a display region DA located in the first portion 1A.

A plurality of conductive layers 811, 812, 813, 814, and 815 spaced apart from each other may be disposed in the first flexible part BA1, and the flexible substrate 100 may include a plurality of through holes TH located in the first flexible part BA1. As illustrated in FIG. 16, the plurality of through holes TH may be disposed in a region between the plurality of conductive layers 811, 812, 813, 814, and 815. In an embodiment, the plurality of through holes TH and the plurality of conductive layers 811, 812, 813, 814, and 815 may not overlap each other.

This configuration may improve the flexibility of the flexible substrate 100 in the first flexible part BA1, and the plurality of through holes TH may absorb the tensile force applied to the first flexible part BA1 to prevent or reduce the damage to the conductive layer 810.

Figure 18:
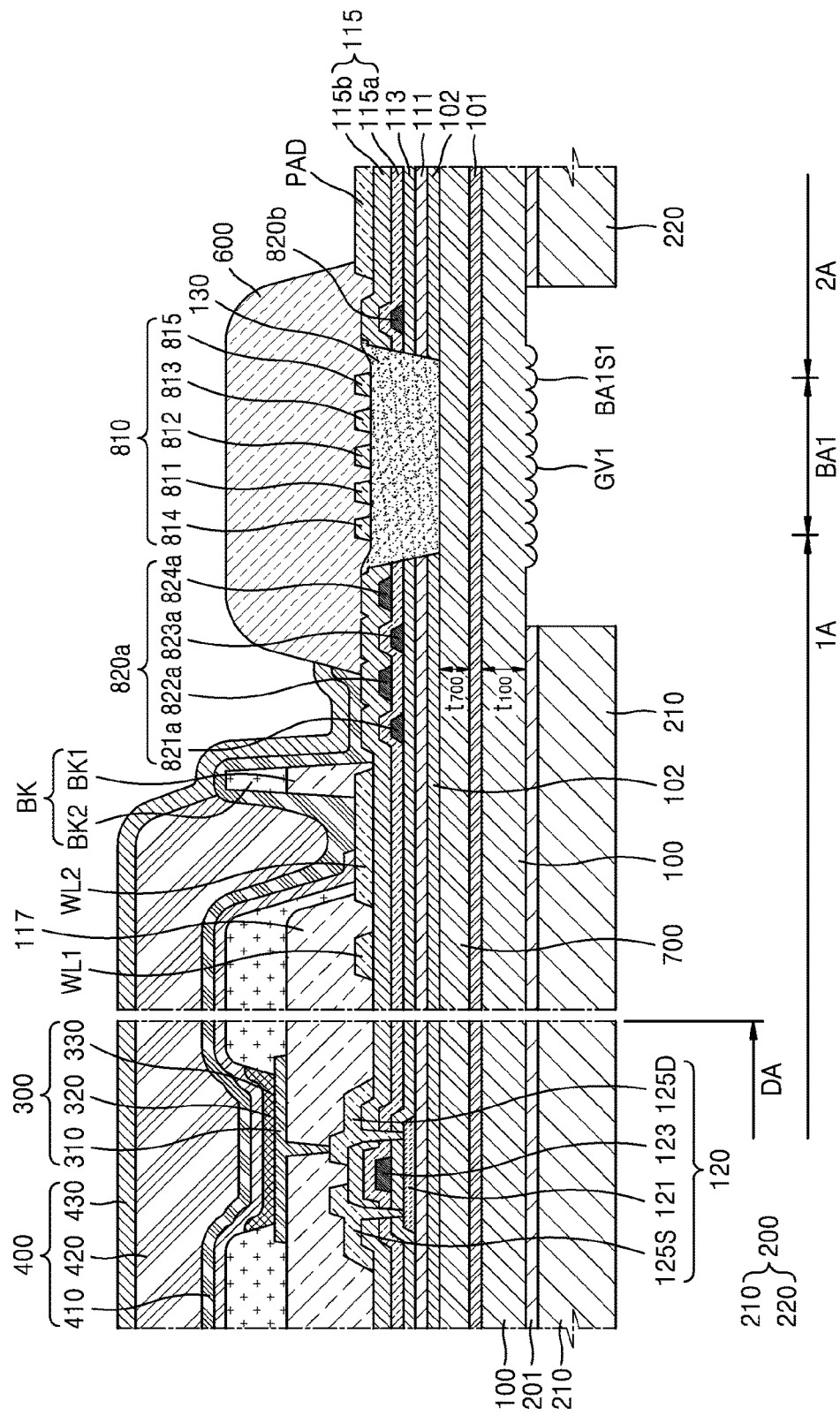
FIG. 18 is a cross-sectional view schematically illustrating a portion of a display apparatus according to an embodiment.

FIG. 18 is a cross-sectional view schematically illustrating a portion of a display apparatus according to an embodiment.

Referring to FIG. 18, a display apparatus according to an embodiment includes: a support substrate 200; a flexible substrate 100 disposed on/over the support substrate 200, including a first flexible part BA1 located between a first portion 1A and a second portion 2A to be bent around a first bending axis BAX1 (see FIG. 2) in the first flexible part BA1, and including a plurality of first uneven portions GV1 located at an inside surface BA1S1 of the first flexible part BA1; and a display unit 300 disposed on/over at least the first portion 1A of the flexible substrate 100.

A first barrier layer 101 contacting the flexible substrate 100 and an additional flexible substrate 700 contacting the first barrier layer 101 may be disposed on the flexible substrate 100, and a second barrier layer 102 may be disposed on the additional flexible substrate 700. The flexible substrate 100 and the additional flexible substrate 700 may include polyimide (PI) and may have a thickness of several µm to tens of µm. For example, a thickness $t_{100}$ of the flexible substrate 100 may be smaller than a thickness $t_{700}$ of the additional flexible substrate 700.

The first barrier layer 101 and the second barrier layer 102 may include inorganic material such as silicon oxide, silicon nitride, and/or silicon oxynitride, and may prevent or reduce the permeation of impurities from the flexible substrate 100 and/or the additional flexible substrate 700 into an active layer 121 of a thin film transistor 120.

The thin film transistor 120 including the active layer 121, a gate electrode 123, a source electrode 125S, and a drain electrode 125D may be disposed on/over the second barrier layer 102. A buffer layer 111 may be disposed between the second barrier layer 102 and the thin film transistor 120, a gate insulating layer 113 may be disposed between the active layer 121 and the gate electrode 123, an interlayer insulating layer 115 may be disposed on the gate electrode 123, and a planarization layer 117 may be disposed on the source electrode 125S and the drain electrode 125D. According to an embodiment, the interlayer insulating layer 115 may include two layers including a first interlayer insulating layer 115a and a second interlayer insulating layer 115b disposed on the first interlayer insulating layer 115a, and conductive layers functioning as lines may be disposed between the first interlayer insulating layer 115a and the second interlayer insulating layer 115b. In an embodiment, in order to minimize the space occupied by lines, in addition to a line disposed in the same layer as the gate electrode 123, lines may be additionally disposed between the first interlayer insulating layer 115a and the second interlayer insulating layer 115b. Although FIG. 18 illustrates that the second interlayer insulating layer 115b is a single layer, the inventive concept is not limited thereto and the second interlayer insulating layer 115b may be a multiple layer.

The display unit 300 including an organic light-emitting device including a pixel electrode 310, an intermediate layer 320, and an opposite electrode 330 may be disposed on the planarization layer 117, and an encapsulation layer 400 may be disposed on the display unit 300.

The encapsulation layer 400 may include a first inorganic encapsulation layer 410, an organic encapsulation layer 420, and a second inorganic encapsulation layer 430, and the first inorganic encapsulation layer 410 may cover the opposite electrode 330 and may include material such as silicon oxide, silicon nitride, aluminum oxide, and/or silicon oxynitride. Also, if necessary, other layers such as a capping layer may be interposed between the first inorganic encapsulation layer 410 and the opposite electrode 330. Since the first inorganic encapsulation layer 410 is formed according to a structure thereunder, a top surface thereof is not flat as illustrated in FIG. 18. The organic encapsulation layer 420 may cover the first inorganic encapsulation layer 410, and a top surface thereof may be made flat unlike the first inorganic encapsulation layer 410. Specifically, the top surface of the organic encapsulation layer 420 may be made substantially flat at a portion corresponding to a display region DA. The organic encapsulation layer 420 may include at least one of polyethylene terephthalate, polyethylene naphthalate, polycarbonate, polyimide, polyethylene sulfonate, polyoxymethylene, polyarylate, and hexamethyldisiloxane. The second inorganic encapsulation layer 430 may cover the organic encapsulation layer 420 and may include material such as silicon oxide, silicon nitride, aluminum oxide, and/or silicon oxynitride. The second inorganic encapsulation layer 420 may prevent the organic encapsulation layer 420 from being exposed outside, by contacting the first inorganic encapsulation layer 410 at an edge thereof located outside the display region DA.

In this manner, the encapsulation layer 400 has a multi-layer structure including the first inorganic encapsulation layer 410, the organic encapsulation layer 420, and the second inorganic encapsulation layer 430. Even when a crack occurs in the encapsulation layer 400, the multi-layer structure may prevent the crack from being connected between the first inorganic encapsulation layer 410 and the organic encapsulation layer 420 or between the organic encapsulation layer 420 and the second inorganic encapsulation layer 430. This may prevent or minimize the formation of a path through which the external moisture or oxygen permeates into the display region DA.

In addition to the display region DA, the first portion 1A of the flexible substrate 100 may include a non-display region disposed between the first flexible part BA1 and the display region DA. For example, a first power line WL1 and a second power line WL2 formed of the same material and disposed in the same layer as the source electrode 125S and the drain electrode 125D may be disposed in the non-display region, and the second power line WL2 may be electrically connected to the opposite electrode 330 of the organic light-emitting device included in the display unit 300. In an embodiment, the planarization layer 117 and a pixel definition layer 119 may extend only to a portion of the non-display region of the display region DA, and at least a portion of the second power line WL2 may not be covered by the planarization layer 117 and the pixel definition layer 119. In an embodiment, the opposite electrode 330 may contact the second power line WL2 by extending from a top portion of the pixel definition layer 119 and the intermediate layer 320 to a top portion of the second power line WL2 that is not covered by the planarization layer 117 and the pixel definition layer 119.

A bank BK may be further disposed between the display region DA and the first flexible part BA1, and the bank BK may include a first bank BK1 disposed in the same layer as the planarization layer 117 and a second bank BK2 disposed in the same layer as the pixel definition layer 119. The bank BK may block the organic encapsulation layer 420 of the encapsulation layer 400 from extending outside the bank BK. In an embodiment, since the organic encapsulation layer 420 is not disposed outside the bank BK, the first inorganic encapsulation layer 410 and the second inorganic encapsulation layer 430 may contact each other.

A plurality of lines drawn from the display region DA to extend to the first flexible part BA1 may be disposed in a region adjacent to the first flexible part BA1 of the first portion 1A. As illustrated in FIG. 18, an additional conductive layer 820a including first additional conductive layers 821a and 823a disposed on the gate insulating layer 113 and second additional conductive layers 822a and 824a disposed on the first interlayer insulating layer 115a may be disposed in the first portion 1A. A plurality of additional conductive layers 820a may be respectively lines transmitting various signals. An additional conductive layer 820b may be disposed in the second portion 2A, and the additional conductive layer 820b disposed in the second portion 2A may be electrically connected to the additional conductive layer 820a disposed in the first portion 1A. A pad portion PAD may be disposed in the second portion 2A, and the pad portion PAD may be connected to an integrated circuit chip (not illustrated) or a flexible printed circuit board.

The flexible substrate 100 may include a plurality of first uneven portions GV1 located at the inside surface BA1S1 of the first flexible part BA1; and an organic layer 130 and a plurality of conductive layers 811, 812, 813, 814, and 815 may be disposed on the additional flexible substrate 700 disposed in the first flexible part BA1. The plurality of conductive layers 811, 812, 813, 814, and 815 may be disposed to be insulated from each other, and at least some of the plurality of conductive layers 811, 812, 813, 814, and 815 may be electrically connected to at least one of the plurality of additional conductive layers 820a.

Although FIG. 18 illustrates that the area of a region where the first uneven portion GV1 is formed is larger than the area of the first flexible part BA1, the inventive concept is not limited thereto and the first uneven portion GV1 may be located only at a portion of the first flexible part BA1. Also, although FIG. 18 illustrates that the top surface (i.e., the outside surface) of the flexible substrate 100 is flat, the inventive concept is not limited thereto and a plurality of uneven portions corresponding to the first uneven portions GV1 may be formed also at the outside surface of the flexible substrate 100. Likewise, a plurality of uneven portions corresponding to the first uneven portions GV1 may be formed also at the first barrier layer 101, the additional flexible substrate 700, and the organic layer 130.

Also, not the first uneven portion GV1 but a through hole TH illustrated in FIG. 11 may be located at the inside surface of the first flexible part BA1 of the flexible substrate 100, and the through hole TH may be disposed to correspond to a region between the plurality of conductive layers 811, 812, 813, 814, and 815. A portion of the cross-sectional view illustrated in FIG. 18 may correspond to a cross section taken along the direction perpendicular to the first bending axis BAX1, and the other portion thereof may correspond to a cross section taken along the direction parallel to the first bending axis BAX1. In an embodiment, the cross-sectional view illustrated in FIG. 18 may not correspond to a cross section taken along one direction.

A bending protection layer 600 covering a conductive layer 810 may be disposed on at least the first flexible part GA1 of the flexible substrate 100. As illustrated in FIG. 18, the bending protection layer 600 may be disposed not only in the first flexible part BA1 but also in the partial regions of the first portion 1A and the second portion 2A adjacent to the first flexible part BA1. The tensile stress applied to the conductive layer 810 may be minimized by locating the stress neutral plane near the conductive layer 810 by adjusting the modulus and thickness of the bending protection layer 600.

The support substrate 200 including a third region 210 disposed on the rear surface of the first portion 1A and a fourth region 220 disposed on the rear surface of the second portion 2A may be disposed under the flexible substrate 100, and an adhesive layer 201 may be disposed between the support substrate 200 and the flexible substrate 100. The support substrate 200 may not be disposed in the first flexible part BA1. In an embodiment, the first uneven portion GV1 of the first flexible part BA1 may be exposed through the space between the third region 210 and the fourth region 220.

According to the above embodiments, since the flexible substrate of the display apparatus includes a plurality of uneven portions or through holes located in the flexible part and the support substrate is not disposed in the flexible part, the flexibility of the display apparatus may be improved.

Hereinafter, a method of manufacturing a display apparatus will be described focusing on a method of manufacturing a flexible substrate 100 included in the display apparatus.

FIGS. 19A to 19H are cross-sectional views sequentially illustrating a method of manufacturing and/or operating the display apparatus of FIG. 3 according to one or more embodiments.

A method of manufacturing a display apparatus according to an embodiment includes: preparing a carrier substrate 900 including a plurality of uneven portions $GV_{900}$; applying (or coating) an organic material 100' on the carrier substrate 900; curing the organic material 100' to form a flexible substrate 100 including a plurality of first uneven portions GV1 located at a surface contacting the carrier substrate 900; forming a display unit 300 on/over the flexible substrate 100; removing the carrier substrate 900; and bending the flexible substrate 100 around a first bending axis BAX1 (see FIG. 2) in a first flexible part BA1 such that the plurality of first uneven portions GV1 are located at an inside surface BA1S1 of the first flexible part BA1.

Figure 19A:
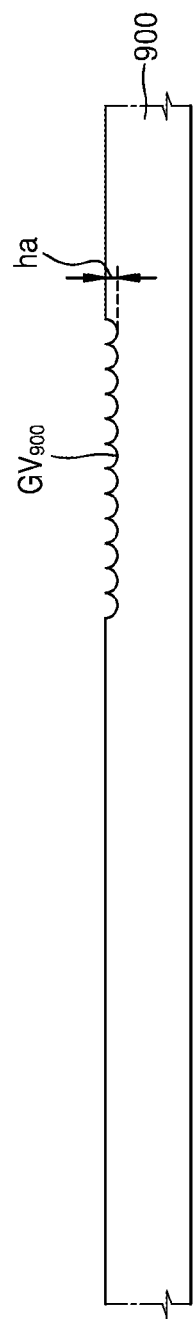
FIG. 19A, FIG. 19B, FIG. 19C, FIG. 19D, FIG. 19E, FIG. 19F, FIG. 19G, and FIG. 19H are cross-sectional views (sequentially) illustrating structures formed in a method of manufacturing and/or operating the display apparatus of FIG. 3 according to one or more embodiments.

Referring to FIG. 19A, a carrier substrate 900 with a plurality of uneven portions $GV_{900}$ formed at a top surface thereof is prepared. The carrier substrate 900 may include glass. In an embodiment, the carrier substrate 900 may include any other material having a high rigidity. The plurality of uneven portions $GV_{900}$ may include a plurality of concave portions, and each of the plurality of concave portions may have a semicylindrical shape extending in one direction. A distance from a flat surface of the carrier substrate 900 to the deepest region of the concave portion, that is, a first height ha of the concave portion may have a predetermined value. According to an embodiment, a height of the carrier substrate 900 may be about 0.2 mm to about 0.7 mm, and the first height ha may have a value of about 10 μm or more. The first height ha may be smaller than a second height hb (see FIG. 23) of the concave portion that is formed at the substrate 900 in order to form a through hole TH (see FIG. 23) at the flexible substrate 100. In an embodiment, the first height ha may be such a height that may be formed on the carrier substrate 900 without the organic material 100' being separated therefrom. According to an embodiment, a width of a region in the carrier substrate 900 where the concave portion is formed may be about 0.1 mm to about 1.4 mm.

The plurality of uneven portions $GV_{900}$ may be formed by various methods such as dry etching, wet etching, or laser patterning.

Figure 19B:
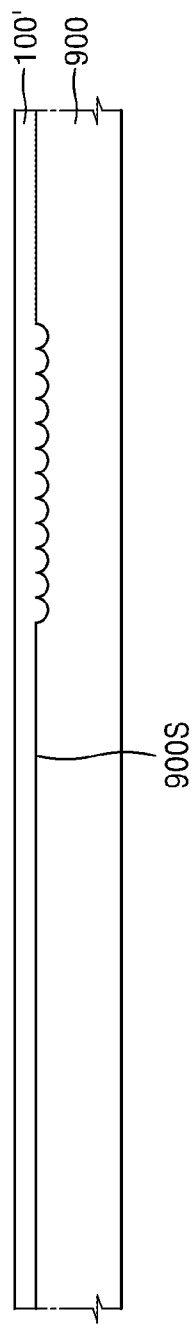

Referring to FIG. 19B, an organic material 100' may be formed to contact a top surface 900S of the carrier substrate 900. For example, the organic material 100' may include a high-flexibility material such as polyimide, and the viscosity of the organic material may be selected properly in consideration of the flexibility of the flexible substrate 100 and the shape of a first uneven portion GV1 formed at the flexible substrate 100 (see FIG. 19C). When the viscosity of the organic material is high, a plurality of first uneven portions GV1 may be formed only at the rear surface of the flexible substrate 100; and when the viscosity of the organic material is low, a plurality of top uneven portions GVa corresponding to a plurality of first uneven portions GV1 may be formed also at the top surface of the flexible substrate 100 as illustrated in FIG. 20.

Although not illustrated in FIG. 19A, the flexible substrate 100 may be formed to include a first uneven portion GV1 as in FIG. 5, that is, a convex portion and a flat region disposed between adjacent convex portions. In an embodiment, the carrier substrate 900 may include a plurality of concave portions that are spaced apart from each other.

For example, a distance between the plurality of concave portions may be about 3 μm to about 130 μm, and a diameter of the concave portion may be about 10 μm to about 100 μm. Also, when a thickness of the organic material 100' formed on the carrier substrate 900 is defined as "t", "t" may be about 4 μm to about 20 μm and a first height ha of the concave portion included in the carrier substrate 900 may be 0.2 t to 0.6 t. However, other numerical values may be applicable in one or more embodiments.

Figure 19C:
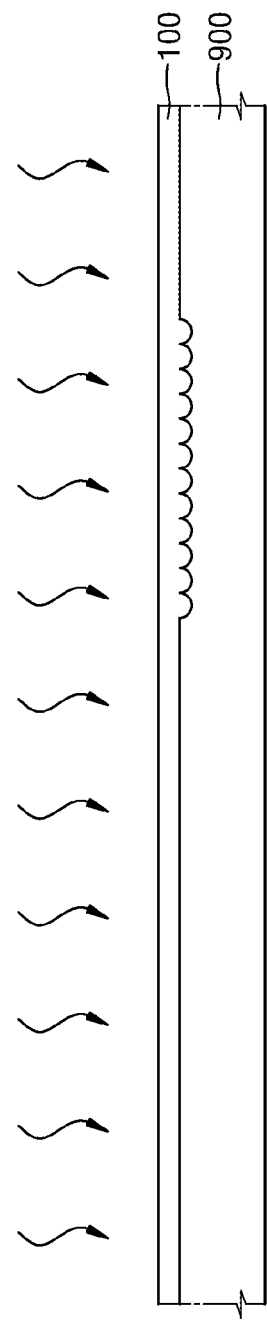
Figure 20:
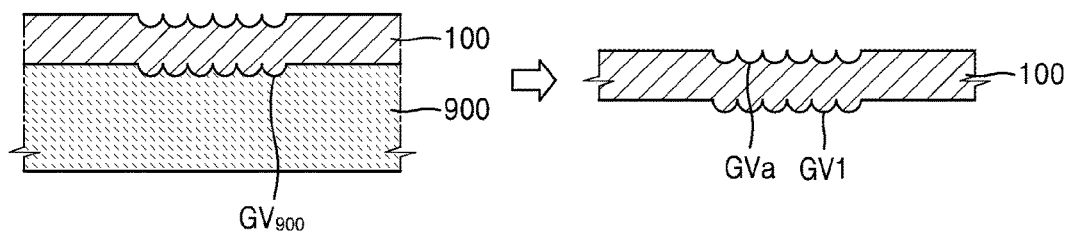
FIG. 20 is a cross-sectional view schematically illustrating a portion of a structure formed in a method of manufacturing a display apparatus according to an embodiment.

Referring to FIG. 19C, the organic material 100' is cured to form a flexible substrate 100 including a plurality of first uneven portions GV1 that are located at a rear surface (that is, a surface corresponding to an inside surface of the first flexible part BA1 after bending) and have a shape corresponding to a plurality of uneven portions $GV_{900}$ included in the carrier substrate 900. Each of the plurality of first uneven portions GV1 may correspond to a region protruding from a flat surface of the flexible substrate 100, and a first height ha of the concave portion formed at the carrier substrate 900 may be substantially equal to a height ha of the first uneven portion GV1. In an embodiment, the first uneven portion GV1 may include a convex portion protruding from a flat surface of the flexible substrate 100, and the convex portion may have a first height ha and may have a semicylindrical shape extending in one direction.

Figure 19D:
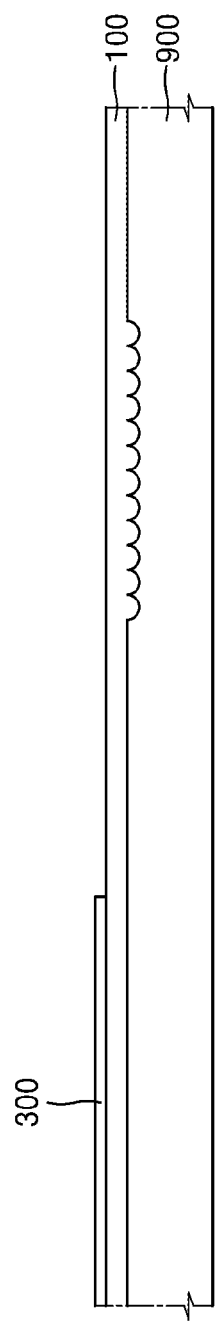
Figure 19E:
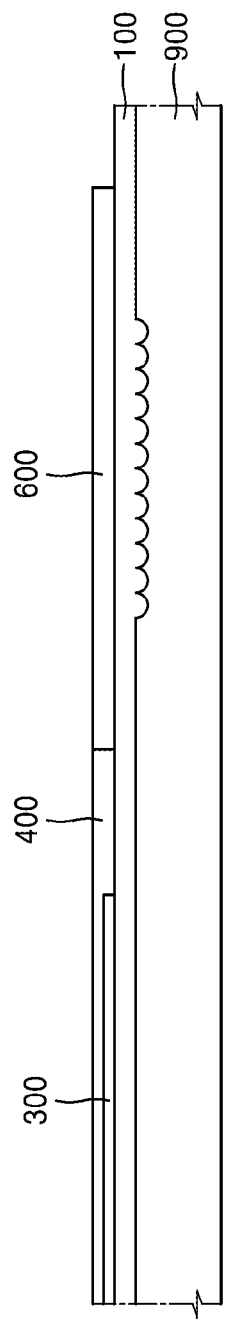

Referring to FIG. 19D and FIG. 19E, a display unit 300, an encapsulation layer 400 covering the display unit 300, and a bending protection layer 600 may be formed on the flexible substrate 100. For example, the display unit 300 may include an organic light-emitting device; however, the inventive concept is not limited thereto. The display unit 300 and the encapsulation layer 400 may be formed on at least a first portion 1A (see FIG. 19G) of the flexible substrate 100, and the bending protection layer 600 may be formed in at least a first flexible part BA1 (see FIG. 19G).

Figure 19F:
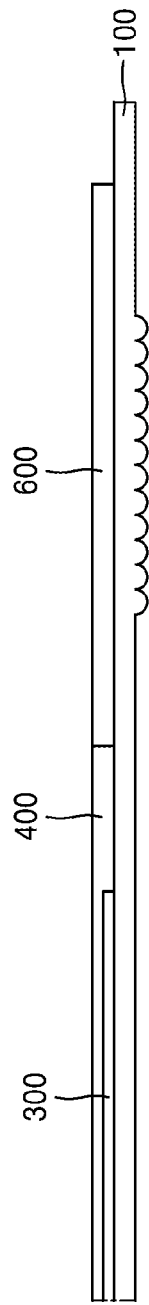

Referring to FIG. 19E and FIG. 19F, the carrier substrate 900 may be removed from the flexible substrate 100. The carrier substrate 900 may be easily removed from the flexible substrate 100 by irradiating laser beams to the interface between the flexible substrate 100 and the carrier substrate 900 and then changing the properties of the surface of the flexible substrate 100 contacting the carrier substrate 900. In an embodiment, the carrier substrate 900 may be removed in one or more of various ways.

Figure 19G:
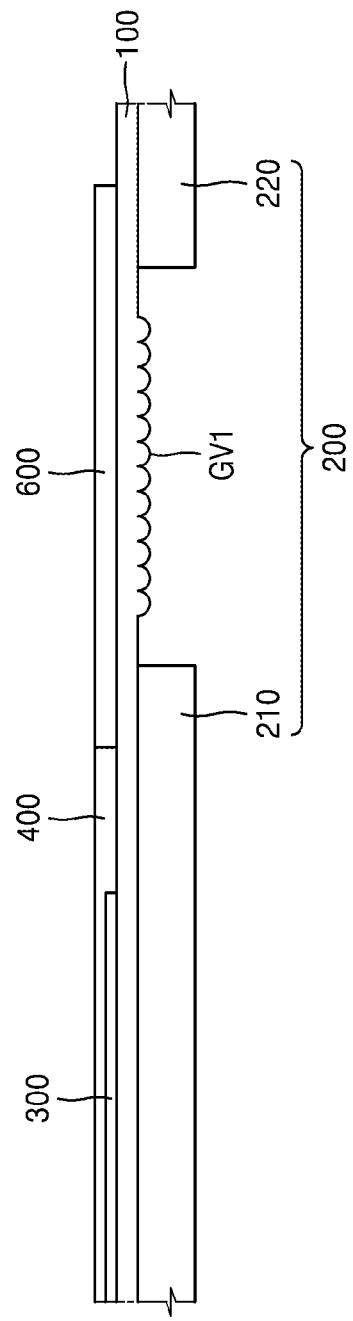

Referring to FIG. 19F and FIG. 19G, a support substrate 200 including a third region 210 and a fourth region 220 spaced apart from the third region 210 may be formed at the rear surface of the flexible substrate 100. The support substrate 200 may not be disposed in a region where a plurality of first uneven portions GV1 is formed. In an embodiment, a plurality of first uneven portion GV1 may be exposed through the space between the third region 210 and the fourth region 220. Although not illustrated in FIG. 19F, the support substrate 200 may be attached to the flexible substrate 100 by using an adhesive layer 201 (see FIG. 3).

Figure 19H:
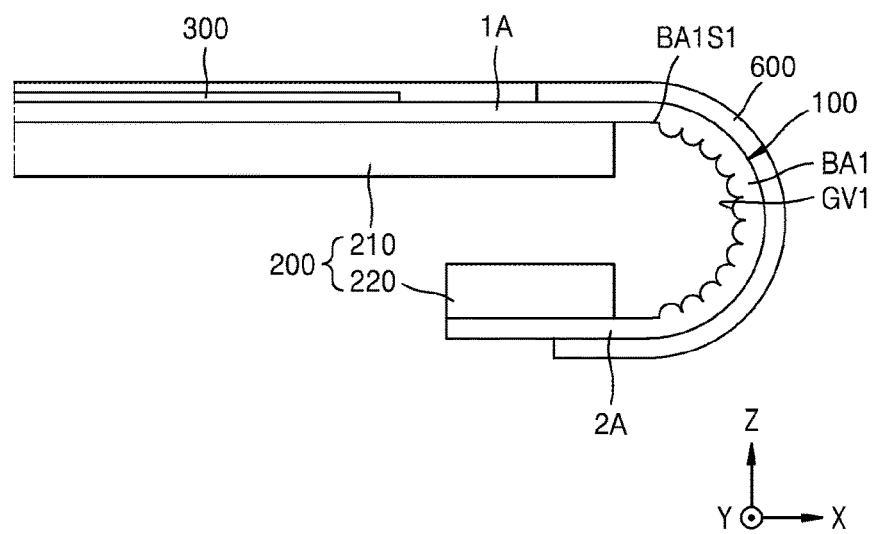

Referring to FIG. 19G and FIG. 19H, the flexible substrate 100 may be bent around a first bending axis BAX1

(see FIG. 2) located in the first flexible part BA1 and/or around a boundary between BA1 and 1A. The regions disposed on both sides of the first flexible part BA1 of the flexible substrate 100 may be defined as a first portion 1A and a second portion 2A. The display region 300 may be disposed in the first portion 1A, and a pad portion (not illustrated) may be disposed in the second portion 2A.

Since the flexible substrate 100 is bent, the plurality of first uneven portions GV1 are located inside the first flexible part BA1 and the rear surface of the first portion 1A and the rear surface of the second portion 2A face each other. In an embodiment, the flexible substrate 100 may be bent such that the rear surface of the first portion 1A and the rear surface of the second portion 2A face each other and the plurality of first uneven portions GV1 is located inside the first flexible part BA1.

As described above, the plurality of first uneven portions GV1 may include a convex portion having a semicylindrical shape, and the bending of the flexible substrate 100 may include bending the flexible substrate 100 around the first bending axis BAX1 (see FIG. 2) extending in a direction parallel to a direction in which the convex portion extends.

Each of FIGS. 20 to 23 is a cross-sectional view schematically illustrating a portion of a structure formed in a method of manufacturing a display apparatus according to an embodiment. FIGS. 20 to 23 illustrate one or more methods of forming a plurality of first uneven portions GV1 or through holes TH at the first flexible part BA1 of the flexible substrate 100 of the display apparatus.

Referring to FIG. 20, an organic material 100' may be formed on a carrier substrate 900 having a plurality of uneven portions $GV_{900}$. The organic material 100' may have a lower viscosity than the organic material 100' of FIG. 19B. Since the organic material 100' has a low viscosity, a plurality of uneven portions may also be formed at the top surface of the organic material 100' as well as at the surface of the organic material 100' contacting the carrier substrate 900.

The organic material 100' may be cured and then the carrier substrate 900 may be removed to form a flexible substrate 100 including a plurality of first uneven portions GV1 formed at an inside surface of a first flexible part BA1 (see FIG. 1) and a plurality of top uneven portions GVa formed at an outside surface thereof to correspond to the plurality of first uneven portions GV1.

Figure 21:
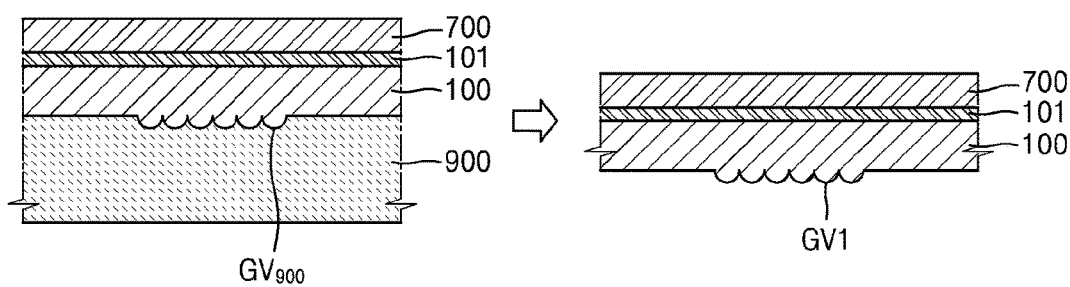
FIG. 21 is a cross-sectional view schematically illustrating a portion of a structure formed in a method of manufacturing a display apparatus according to an embodiment.

Referring to FIG. 21, an organic material 100', a first barrier layer 101, and an additional organic material 700' may be formed on a carrier substrate 900 having a plurality of uneven portions $GV_{900}$. The organic materials may be cured and then the carrier substrate 900 may be removed to form a flexible substrate 100 including a plurality of first uneven portions GV1 formed at an inside surface of a first flexible part BA1 (see FIG. 1) and a first barrier layer 101 and an additional flexible substrate 700 disposed on the flexible substrate 100.

The organic material 100' and the additional organic material 700' may include the same material, for example, polyimide. Also, the thickness of a flat region of the organic material 100' may be larger than the thickness of the additional organic material 700'. In an embodiment, the organic material 100' and the additional organic material 700' may be different materials, and the thicknesses thereof may be equal to each other or the thickness of the additional organic material 700' may be larger than the thickness of the organic material 100'.

Figure 22:
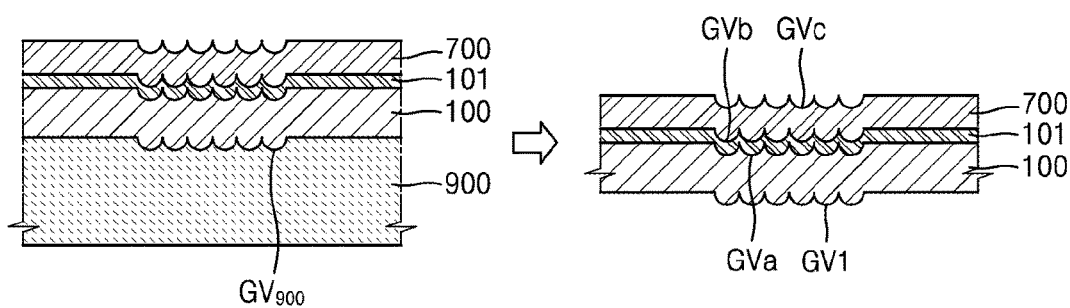
FIG. 22 is a cross-sectional view schematically illustrating a portion of a structure formed in a method of manufacturing a display apparatus according to an embodiment.

Referring to FIG. 22, an organic material 100', a first barrier layer 101, and an additional organic material 700' may be formed on a carrier substrate 900 having a plurality of uneven portions $GV_{900}$. In an embodiment, a plurality of uneven portions corresponding to the plurality of uneven portions $GV_{900}$ formed at the carrier substrate 900 may be formed not only at the surface of the organic material 100' contacting the carrier substrate 900 but also at the top surface of the organic material 100', the top surface of the first barrier layer 101, and the top surface of the additional organic material 700'.

The organic material 100' and the additional organic material 700' may be cured and then the carrier substrate 900 may be removed to form a flexible substrate 100 including a plurality of first uneven portions GV1 formed at an inside surface of a first flexible part BA1 (see FIG. 1) and a plurality of top uneven portions GVa formed at an outside surface thereof, a first barrier layer 101 at top and bottom surfaces of which a plurality of uneven portions are formed, and an additional flexible substrate 700 including a plurality of uneven portions GVb formed at a bottom surface thereof and a plurality of uneven portions GVc formed at a top surface thereof.

The organic material 100' and the additional organic material 700' of FIG. 22 may have a lower viscosity than the organic material 100' and the additional organic material 700' of FIG. 21. Thus, when an uneven portion is formed a bottom surface thereof, a corresponding uneven portion may also be formed at a top surface thereof.

Figure 23:
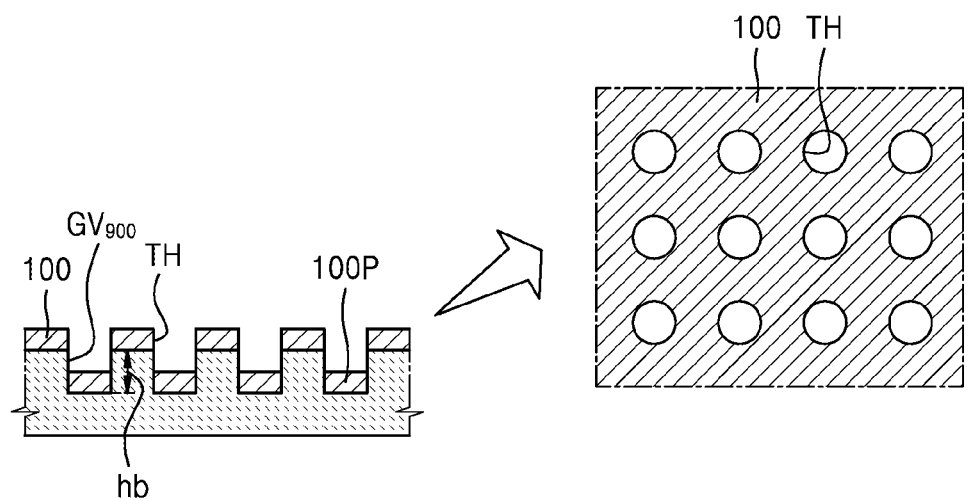
FIG. 23 is a cross-sectional view schematically illustrating a portion of a structure formed in a method of manufacturing a display apparatus according to an embodiment.

Referring to FIG. 23, a carrier substrate 900 may include a plurality of uneven portions $GV_{900}$ including a convex portion and a concave portion, and an organic material 100' may be formed on the carrier substrate 900. In an embodiment, a second height hb of the concave portion with respect to the convex portion may have a greater value than the first height ha of FIG. 19A, and the organic material 100' applied (or coated) on the convex portion and the organic material 100' applied on the concave portion may be separated from each other. According to an embodiment, the concave portion may have a circular cross section, and the organic material 100' applied on the concave portion may be removed simultaneously when the carrier substrate 900 is removed after the organic material 100' is cured. However, the cross-sectional shape of the concave portion is not limited to a circular shape and may be one or more of various shapes such as polygonal shapes.

Thus, a flexible substrate 100 including a plurality of through holes TH may be formed as illustrated in a plan view illustrated on the right side of FIG. 23.

Although not illustrated, in order to manufacture the display apparatus of FIG. 14, a method of manufacturing a display apparatus according an embodiment may further include, after the removing of the carrier substrate 900, bending the flexible substrate 100 around a second bending axis BAX2 in a second flexible part BA2 such that a plurality of second uneven portions GV2 are located at an inside surface of the second flexible part BA2. In an embodiment, in addition to a plurality of uneven portions corresponding to a plurality of first uneven portions GV1 formed in a first flexible part BA1, the carrier substrate 900 may further include a plurality of uneven portions corresponding to a plurality of second uneven portions GV2 formed in a second flexible part BA2. In an embodiment, on the top surface of the carrier substrate 900, the plurality of uneven portions corresponding to the plurality of first uneven portions GV1 and the plurality of uneven portions corresponding to the plurality of second uneven portions GV2 may be disposed to be spaced apart from each other.

A curvature radius of the first flexible part GA1 may be smaller than a curvature radius of the second flexible part GA2, and in an embodiment, a density of the plurality of first uneven portions GV1 may be greater than a density of the plurality of second uneven portions GV2. In an embodiment, a plurality of uneven portion groups having different densities and spaced apart from each other may be formed at the top surface of the carrier substrate 900 and then an organic material 100' may be formed on the carrier substrate 900 and cured and then the carrier substrate 900 may be removed to form a flexible substrate 100 where a plurality of first uneven portions GV1 and a plurality of second uneven portions GV2 are formed.

FIGS. 24A to 24E are cross-sectional views sequentially illustrating a portion of a method of manufacturing a display apparatus according to an embodiment.

Figure 24A:
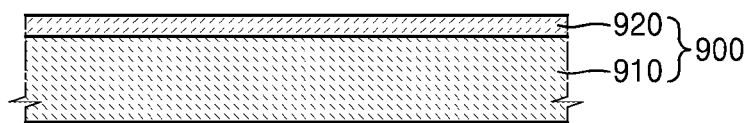
FIG. 24A, FIG. 24B, FIG. 24C, FIG. 24D, and FIG. 24E are cross-sectional views (sequentially) illustrating portions of structures formed in a method of manufacturing a display apparatus according to one of more embodiments.

Referring to FIG. 24A, an inorganic layer 920 is formed on a base substrate 910. The base substrate 910 may include glass, and the inorganic layer 920 may include a transparent inorganic material such as silicon oxide ($SiO_2$) or aluminum oxide ($Al_2O_3$). Herein, the base substrate 910 and the inorganic layer 920 may correspond to a carrier substrate 900. The transparent inorganic material of the inorganic layer 920 may have substantially the same transmittance as the glass of the base substrate 910. In an embodiment, the transmittance thereof with respect to laser beams may be about 45% or more. This is to maintain the intensity of laser beams, which reach the boundary between the carrier substrate 900 and the flexible substrate 100 when the carrier substrate 900 is separated from the flexible substrate 100 as illustrated in FIG. 24E, at the same level as in the case where the carrier substrate 900 includes only glass. By this configuration, the carrier substrate 900 may be easily separated from the flexible substrate 100.

Although not illustrated, according to an embodiment, the inorganic layer 920 may further include iron oxide ($Fe_2O_3$) or nanoparticles in addition to a transparent inorganic material.

Figure 24B:
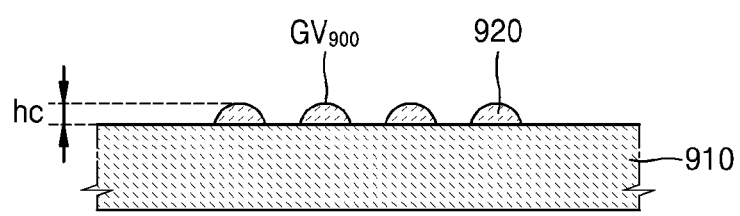

Referring to FIG. 24B, the inorganic layer 920 may be etched to form a carrier substrate 900 including a plurality of uneven portions $GV_{900}$. The plurality of uneven portions $GV_{900}$ may include a plurality of convex portions, and each of the plurality of convex portions may have a semicylindrical shape extending in one direction. A third height hc of each of the plurality of convex portions may be about 0.1 μm to about 2 μm. The third height hc may be smaller than the first height ha of FIG. 19A and the second height hb of FIG. 23. In an embodiment, for example, the third height hc may be determined according to the thickness of an inorganic layer 920 formed by coating, and the thickness of the inorganic layer 920 may be about 2 μm or less.

When the carrier substrate 900 includes the inorganic layer 920 and the base substrate 910 including glass and the inorganic layer 920 is etched to form convex portions, the time taken to perform an etching process for forming the convex portions may be reduced in comparison with the case where the carrier substrate 900 includes only glass.

Figure 24C:
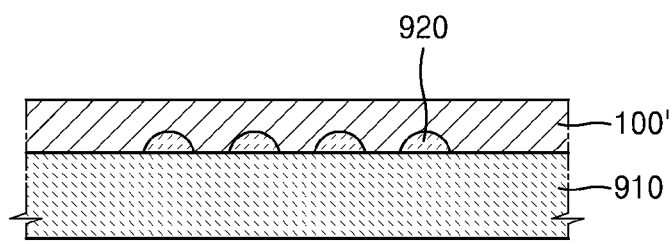

Referring to FIG. 24C, an organic material 100' may be formed to contact the top surface of the carrier substrate 900. For example, the organic material 100' may include a high-flexibility material such as polyimide.

Figure 24D:
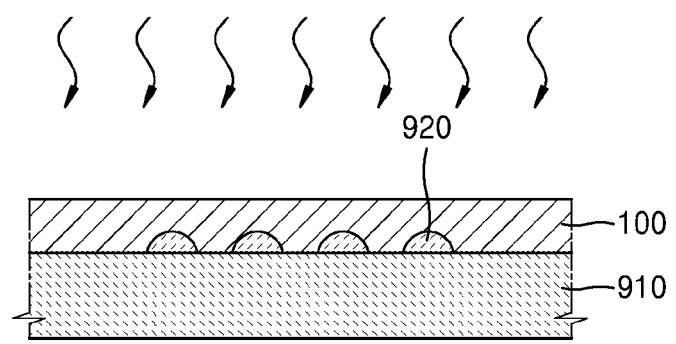
Figure 24E:
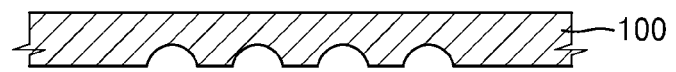

Referring to FIG. 24D, the organic material 100' is cured to form a flexible substrate 100 including a plurality of first uneven portions GV1 that are located at a rear surface (that is, a surface corresponding to an inside surface of the first flexible part BA1 after bending) and have a shape corresponding to a plurality of uneven portions $GV_{900}$ included in the carrier substrate 900. Each of the plurality of first uneven portions GV1 may correspond to a region concaved with respect to a flat surface of the flexible substrate 100. In an embodiment, by the first uneven portion GV1, the thickness of the flexible substrate 100 includes a region with a reduced thickness in the first flexible part BA1.

Referring to FIG. 24E, the carrier substrate 900 may be removed from the flexible substrate 100. The carrier substrate 900 may be easily removed from the flexible substrate 100 by irradiating laser beams to the interface between the flexible substrate 100 and the carrier substrate 900 and then changing the properties of the surface of the flexible substrate 100 contacting the carrier substrate 900. In an embodiment, the carrier substrate 900 may be removed in one or more of various ways.

Although not illustrated, a display unit may be formed on/over the flexible substrate 100 before the removing of the carrier substrate 900, and a support substrate 200 may be attached thereto after the removing of the carrier substrate 900.

As described above, the forming of the flexible substrate 100 including uneven portions may be performed in a mother substrate state including a plurality of cells corresponding to a plurality of display apparatuses, and a mask and an align key may be used to align the uneven portion, which is formed at the carrier substrate 900, to correspond to a flexible part of each cell.

The above display apparatus manufacturing methods may easily form a plurality of uneven portions GV1 or through holes TH at one surface of the flexible substrate 100 including a high-flexibility material such as polyimide by using the patterned carrier substrate 900. The plurality of uneven portions GV1 and through holes TH formed by this method may have a low roughness and a high uniformity.

As described above, according to embodiments, display apparatuses may have satisfactory flexibility at least because of uneven portions or through holes at flexible substrates. According to embodiments, methods of manufacturing display apparatuses may enable accurate and easy formation of uneven portions or through holes at flexible substrates. According to embodiments, the minimum curvature radius and/or flexibility of a bendable/flexible part of a display apparatus may be optimized through configurations (e.g. sizes, spaces, cross-section shapes, pitch, and/or density) of protrusions and/or recesses at the bendable/flexible part. Advantageously, desirable structures and/or satisfactory performance of display apparatuses may be attained.

While example embodiments have been described, it will be understood by those of ordinary skill in the art that various changes in form and details may be made to the example embodiments without departing from the spirit and scope defined by the following claims.

What is claimed is:

1. A display apparatus comprising:
a first support substrate;
a flexible substrate overlapping the first support substrate and comprising a first portion, a second portion, and a first flexible part located between the first portion and the second portion, wherein the first flexible part comprises a first uneven surface, wherein the first uneven surface comprises a plurality of protrusions, and wherein the first flexible part at the plurality of protrusions is thicker than at least one of a thickest part of the first portion and a thickest part of the second portion; and
a display unit overlapping the first portion.

2. The display apparatus of claim 1, wherein a face of the first portion faces a face of the second portion and is connected through the first uneven surface to the face of the second portion.

3. The display apparatus of claim 1,
wherein the first portion comprises a second flexible part, and
wherein the second flexible part comprises a second uneven surface.

4. The display apparatus of claim 3,
wherein
a minimum curvature radius of the first flexible part is less than a minimum curvature radius of the second flexible part, and wherein a density of protrusions of the first uneven surface is greater than a density of protrusions of the second uneven surface.

5. The display apparatus of claim 1, further comprising:
a second support substrate,
wherein the second support substrate overlaps the second portion and is spaced from the first support substrate.

6. The display apparatus of claim 5, wherein the first uneven surface is exposed through a space between the first support substrate and the second support substrate.

7. The display apparatus of claim 1, further comprising:
a barrier layer positioned on the flexible substrate, wherein a first face of the barrier layer is in contact with an opposite surface of the flexible substrate, and wherein the opposite surface of the flexible substrate is opposite the first uneven surface; and
a flexible layer positioned on the barrier layer and in contact with a second face of the barrier layer, wherein the second face of the barrier layer is opposite the first face of the barrier layer.

8. The display apparatus of claim 7,
wherein a material of the flexible substrate is identical to a material of the flexible layer, and
wherein a thickness of the flexible substrate is unequal to a thickness of the flexible layer.

9. The display apparatus of claim 1,
wherein each protrusion of the plurality of protrusions extends parallel to a boundary between the first portion and the first flexible part.

10. The display apparatus of claim 1,
wherein the first flexible part comprises a second uneven surface,
wherein the second uneven surface is opposite the first uneven surface and comprises a plurality of recesses, and
wherein the recesses respectively overlap the protrusions.

11. A display apparatus comprising:
a support substrate;
a flexible substrate overlapping the support substrate and comprising a first portion, a second portion, and a flexible part located between the first portion and the second portion, wherein the flexible part comprises an uneven surface, wherein the uneven surface comprises a plurality of openings of through holes;
a pad positioned on the second portion;
a plurality of conductors electrically connected to the pad and extending to at least one of the first portion and the flexible part;
an organic layer positioned between the flexible part and the plurality of conductors and covering the plurality of openings of through holes; and
a display unit overlapping the first portion.

12. The display apparatus of claim 11, wherein the openings of through holes are located between the conductors in a plan view of the display apparatus.

* * * * *